United States Patent
Sekido

(10) Patent No.: US 6,941,535 B2
(45) Date of Patent: Sep. 6, 2005

(54) DESIGN SYSTEM OF SEMICONDUCTOR INTEGRATED CIRCUIT ELEMENT, PROGRAM, PROGRAM PRODUCT, DESIGN METHOD OF SEMICONDUCTOR INTEGRATED CIRCUIT ELEMENT, AND SEMICONDUCTOR INTEGRATED CIRCUIT ELEMENT

(75) Inventor: Yuji Sekido, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 36 days.

(21) Appl. No.: 10/342,297

(22) Filed: Jan. 15, 2003

(65) Prior Publication Data

US 2003/0167452 A1 Sep. 4, 2003

(30) Foreign Application Priority Data

Mar. 4, 2002 (JP) ........................ 2002-057530

(51) Int. Cl.[7] ............................ G06F 17/50; G06F 9/45
(52) U.S. Cl. ............................................. 716/8; 716/12
(58) Field of Search ........................................ 716/1–21

(56) References Cited

U.S. PATENT DOCUMENTS

| 5,512,766 | A | * | 4/1996 | Kusunoki et al. ........... 257/296 |
| 5,869,852 | A | * | 2/1999 | Kinoshita .................... 257/207 |
| 6,170,079 | B1 | * | 1/2001 | Kato et al. .................... 716/10 |
| 6,434,730 | B1 | * | 8/2002 | Ito et al. ......................... 716/8 |
| 6,480,992 | B1 | * | 11/2002 | Runyon ........................ 716/10 |
| 6,487,702 | B2 | * | 11/2002 | Lin et al. ........................ 716/4 |
| 6,496,964 | B2 | * | 12/2002 | Inui et al. ....................... 716/8 |
| 6,523,159 | B2 | * | 2/2003 | Bernstein et al. ............. 716/10 |
| 6,618,844 | B2 | * | 9/2003 | Dansky et al. ................. 716/5 |
| 2002/0040467 | A1 | * | 4/2002 | Dansky et al. ................. 716/10 |
| 2003/0006481 | A1 | * | 1/2003 | Miyada et al. .............. 257/532 |
| 2003/0033578 | A1 | * | 2/2003 | Chan et al. .................... 716/2 |
| 2003/0148578 | A1 | * | 8/2003 | Ku et al. ..................... 438/239 |
| 2004/0073881 | A1 | * | 4/2004 | Nassif et al. ................. 716/10 |

* cited by examiner

Primary Examiner—Stacy A. Whitmore
Assistant Examiner—Magid Y. Dimyan
(74) Attorney, Agent, or Firm—Staas & Halsey LLP

(57) ABSTRACT

A design system, a program, a program product and a design method which can easily design a semiconductor integrated circuit element having a decoupling capacitor are provided. In an element region which serves as an IC chip 100, an input/output block 110 is arranged, and analog-signal-circuit blocks 120 etc. are arranged. In the capacity insertion regions 160 etc. of an open region 115 which does not belong to the blocks, unit capacity cells 10*a* are arranged in a latticed pattern. Analog wiring lines 170 are arranged between the input/output block 110 and the analog-signal-circuit blocks 120 etc., and the unit capacity cells 10*a* of the capacity insertion region 160 are respectively connected wiring lines 171 and 172 of power source and GND potentials by via-conductors 173 and 174. Thereafter, unit cells 180 are arranged, and wiring lines 190 for the connections between the unit cells and between the input/output block 110 and memory blocks 140 etc. are arranged. Further, the unit capacity cells 10*a* of the capacity insertion regions 161 etc. are respectively connected to power source and GND wiring lines 191 and 192 by via-conductors.

21 Claims, 16 Drawing Sheets

FLOW CHART SHOWING DESIGN PROCEDURE OF IC CHIP IN EMBODIMENT

FLOW CHART SHOWING DESIGN PROCEDURE OF IC CHIP IN PRIOR ART

ARCHITECTURAL DIAGRAM OF DESIGN SYSTEM OF IC CHIP IN EMBODIMENT

FLOW CHART SHOWING DESIGN PROCEDURE OF IC CHIP IN EMBODIMENT

EXPLANATORY DIAGRAM SHOWING A STATE WHERE I/O BLOCK, ANALOG-SIGNAL-CIRCUIT BLOCKS, MEMORY BLOCKS, CPU CORE AND OTHER FUNCTION BLOCKS ARE ARRANGED ON IC CHIP

EXPLANATORY DIAGRAM SHOWING A STATE WHERE LARGE NUMBER OF UNIT CAPACITY CELL BLOCKS ARE ARRANGED IN ADJACENCY TO ONE ANOTHER IN OPEN REGION OF IC CHIP IN WHICH FUNCTION BLOCKS ARE NOT ARRANGED

EXPLANATORY VIEW SHOWING PLAN STRUCTURE OF UNIT CAPACITY CELL

FIG. 7 EXPLANATORY VIEW SHOWING STRUCTURE OF UNIT CAPACITY CELL TAKEN ALONG SECTION A-A' IN FIG.6

EXPLANATORY VIEW SHOWING STRUCTURE OF UNIT CAPACITY CELL TAKEN ALONG SECTION B-B' IN FIG.6

EXPLANATORY DIAGRAM SCHEMATICALLY SHOWING CIRCUIT ARRANGEMENT OF UNIT CAPACITY CELL

FIG. 10 EXPLANATORY VIEW SHOWING A STATE WHERE A PLURALITY OF UNIT CAPACITY CELLS ARE ARRANGED IN LATTICED PATTERN SO AS TO BE ADJACENT TO ONE ANOTHER

EXPLANATORY VIEW SHOWING A STATE WHERE WIRING LINES ARE FORMED BETWEEN I/O BLOCK AND ANALOG-SIGNAL-CIRCUIT BLOCKS IN IC CHIP

FIG. 12 EXPLANATORY VIEW SHOWING A STATE WHERE VIA-CONDUCTOR ARE ARRANGED BETWEEN VD WIRING LINES AS WELL AS VS WIRING LINES AND UNIT CAPACITY CELLS

EXPLANATORY VIEW SHOWING A STATE WHERE UNIT CELLS ARE ARRANGED IN OPEN REGION OF IC CHIP IN WHICH FUNCTION BLOCKS AND UNIT CAPACITY CELL BLOCKS ARE NOT ARRANGED

EXPLANATORY VIEW SHOWING A STATE WHERE WIRING LINES ARE FORMED BETWEEN FUNCTION BLOCKS SUCH AS BETWEEN I/O BLOCK AND MEMORY BLOCKS, CPU CORE AND OTHER FUNCTION BLOCKS AND BETWEEN ANALOG-SIGNAL-CIRCUIT BLOCKS AND CPU CORE AND MEMORY BLOCKS, BETWEEN FUNCTION BLOCKS AND UNIT CELLS, AND SO FORTH IN IC CHIP

FLOW CHART SHOWING DESIGN PROCEDURE OF IC CHIP ACCORDING TO MODIFICATION 1

EXPLANATORY VIEW SHOWING A STATE WHERE UNIT CELLS ARE ARRANGED IN OPEN REGION OF IC CHIP IN WHICH FUNCTION BLOCK AND UNIT CAPACITY CELL BLOCKS ARE NOT ARRANGED

FLOW CHART SHOWING DESIGN PROCEDURE OF IC CHIP ACCORDING TO MODIFICATION 2

DESIGN SYSTEM OF SEMICONDUCTOR INTEGRATED CIRCUIT ELEMENT, PROGRAM, PROGRAM PRODUCT, DESIGN METHOD OF SEMICONDUCTOR INTEGRATED CIRCUIT ELEMENT, AND SEMICONDUCTOR INTEGRATED CIRCUIT ELEMENT

CROSS-REFERENCE TO RELATED APPLICATIONS

This application is based upon and claims the benefit of priority from each of the prior Japanese patent Application No. 2002-57530 filed in Mar. 4, 2002, the entire contents of which are incorporated herein by reference.

BACKGROUND OF THE INVENTION

1. Field of the Invention

The present invention relates to the design system of a semiconductor integrated circuit element, a program and a program product for causing a computer to function as the design system, the design method of a semiconductor integrated circuit element, and a semiconductor integrated circuit element.

2. Description of Related Art

With the microfabrication of semiconductor integrated circuits in recent years, measures against the noise of a semiconductor integrated circuit element have become important. Mentioned as a technique for the measures is one wherein a decoupling capacitor is inserted into the power source circuit (between the power source wiring and ground wiring) of the integrated circuit, thereby to stabilize the potentials of the power source circuit and to attain the stable operation and enhanced characteristics of the integrated circuit.

Especially in the integrated circuit in which an analog circuit and a digital circuit are coexistent, it is effective to insert the capacitor between the power source wiring in the analog circuit (power source wiring for the analog circuit) and the ground wiring.

Meanwhile, in designing a semiconductor integrated circuit element, a chip layout is first determined. More specifically, as shown in the flow chart of FIG. 1, an input/output block is arranged at a step S101. Thereafter, the arrangement of analog-signal-circuit blocks which afford functions and characteristics to be achieved by the integrated circuit element, and function blocks such as a CPU core, is determined (step S102). Subsequently, the arrangement of the wiring lines between the input/output block and the analog-signal-circuit blocks is determined (step S103). The wiring lines for transferring analog signals need to be laid in consideration of the influence of noise, and impedance matching, and the parts are sometimes determined by the manual work of a designer. Thereafter, at a step S104, unit cells which are formed of logic circuits such as NAND, NOR, INV and FF are arranged between the function blocks. Further, at a step S105, the wiring lines between the unit cells, between the input/output block and the function blocks, between the function blocks, between the function blocks and the unit cells, etc. are determined. Thus, the arrangement and wiring of the layout pattern of an IC chip is completed.

In case of inserting the capacitor stated above, the capacitor is manually inserted and formed in an open space after the determination of the chip layout or amidst the above layout operations, and the capacitor and the power source wiring are often connected manually. More specifically, as shown in FIG. 1 by way of example, at a step S106, the capacitor is formed in the open space which belongs to neither the input/output block nor the function blocks, such as the interstice between the input/output block and the function block or the interstice between the function blocks, and the capacitor and the power source wiring are connected (step S107), whereby the layout pattern of the IC chip is finished up.

On the other hand, the chip layout has recently been automated, and an automatic layout tool is often employed especially for a large-scale integrated circuit. In case of employing the automatic layout tool in this manner, the arrangement of the capacitor is inevitably done after the completion of the layout as shown in the flow chart of FIG. 1.

Since, however, the arrangement of the input/output block and the function blocks is preferred at the stage of design, the open space in which the capacitor can be formed differs in shape and size variously. It is troublesome and has increased the cost of the design to design and arrange the capacitor manually in adaptation to the open space. Especially when the capacitor is manually arranged after the completion of the layout, a large number of restraints are involved, and long working hours are expended in appropriately arranging the capacitor in the open space so as to ensure a larger capacity. Nevertheless, a demand for shortening a design and development period is making it difficult more and more to secure sufficient working hours. Moreover, since skill is required for the way of arrangement, etc., the electrostatic capacitance of the capacitor obtained is often different depending also upon the degree of skill of an operator, and it is sometimes difficult to appropriately form the capacitor having the large electrostatic capacitance.

SUMMARY OF THE INVENTION

The present invention has been made in order to solve the problems as mentioned above, and has for its object to provide a design system which can easily design a semiconductor integrated circuit element having a decoupling capacitor, a program product which causes a computer to function as the design system, a design method which can facilitate the design of a semiconductor integrated circuit element having a decoupling capacitor, and the semiconductor integrated circuit element thus designed.

In order to accomplish the object, the design system of a semiconductor integrated circuit element according to one aspect of the present invention consists in a design system of a semiconductor integrated circuit element, comprising input/output-block arrangement unit for determining arrangement of an input/output block; function-block arrangement unit for determining arrangement of all function blocks which include an analog-signal-circuit block; unit-capacity-cell arrangement unit for arranging a plurality of unit capacity cell blocks in adjacency to each other in, at least, an interstice between the input/output block and the analog-signal-circuit block within that open region of an element region which does not belong to any of the input/output block and the function blocks; the unit capacity cell blocks symbolizing unit capacity cells each of which includes a unit capacitor composed of a first electrode to be set at a first power source potential, a dielectric layer, and a second electrode opposing to the first electrode through the dielectric layer and to be set at a second power source potential, and which have such a connection wiring pattern that, when the unit capacity cells are arranged in adjacency to each other, the first electrodes of the adjacent unit capacity cells can be electrically connected to each other, while the second electrodes thereof can be electrically connected to each other; analog-wiring arrangement unit for determining arrangement of wiring lines between the input/output block and the analog-signal-circuit block; and via-conductor arrangement unit for determining arrangement of at least one first via-conductor which is electrically connected with the first electrode while extending from at least one first power source wiring line to be set at the first power source potential, among the wiring lines, and at least one second via-conductor which is electrically connected with the second electrode while extending from at least one second power source wiring line to be set at the second power source potential, among the wiring lines.

According to this design system, the input/output block and the function blocks including the analog-signal-circuit block are arranged, and the plurality of unit capacity cell blocks are arranged in the interstice between the input/output block and the analog-signal-circuit block, so that a place for the arrangement of a decoupling capacitor constituted by the plurality of unit capacity cells can be easily held in the element region. Besides, since the arrangement of the first via-conductor and the second via-conductor is determined by the via-conductor arrangement unit, the semiconductor integrated circuit element can be easily designed so that the plurality of unit capacity cells, accordingly the decoupling capacitor, may be connected to the first power source wiring line and the second power source wiring line. Thus, the design system is permitted to easily design the semiconductor integrated circuit element having the decoupling capacitor. Besides, since the decoupling capacitor based on the unit capacity cell blocks is arranged in the interstice between the input/output block and the analog-signal-circuit block, the stable operation of especially the analog-signal-circuit block can be attained by the semiconductor integrated circuit element designed. Besides, since the unit capacity cell blocks are employed, the decoupling capacitor which is suited to the shape of the interstice between the input/output block and the analog-signal-circuit block, or the like can be constructed with ease.

Here in this specification, the first power source potential and the second power source potential shall cover also a case where one of them is a power source potential, while the other is a ground potential.

Besides, the "relationship of a mirror image" concretely signifies such a relationship that, when a rectangle is bent so as to place its two opposing sides on each other, the lead-out positions of the first electrodes are placed on each other and so are those of the second electrodes. Accordingly, the right side and left side of the rectangle become laterally symmetric, and the upper side and lower side thereof become vertically symmetric.

In order to accomplish the object, the design system of a semiconductor integrated circuit element according to another aspect of the present invention consists in a design system of a semiconductor integrated circuit element, comprising input/output-block arrangement unit for determining arrangement of an input/output block; function-block arrangement unit for determining arrangement of all function blocks; unit-capacity-cell arrangement unit for arranging a plurality of unit capacity cell blocks in adjacency to each other in an interstice between the input/output block and the function block or in an interstice between the function blocks within that open region of the element region which does not belong to any of the input/output block and the function blocks; the unit capacity cell blocks symbolizing unit capacity cells each of which includes a unit capacitor composed of a first electrode to be set at a first power source potential, a dielectric layer, and a second electrode opposing to the first electrode through the dielectric layer and to be set at a second power source potential, and which have such a connection wiring pattern that, when the unit capacity cells are arranged in adjacency to each other, the first electrodes of the adjacent unit capacity cells can be electrically connected to each other, while the second electrodes thereof can be electrically connected to each other; wiring arrangement unit for determining arrangement of wiring lines between the input/output block and the function block and wiring lines between the function blocks; and via-conductor arrangement unit for determining arrangement of at least one first via-conductor which is electrically connected with the first electrode while extending from at least one first power source wiring line to be set at the first power source potential, among the wiring lines, and at least one second via-conductor which is electrically connected with the second electrode while extending from at least one second power source wiring line to be set at the second power source potential, among the wiring lines.

According to this design system, the input/output block and the function blocks are arranged, and the plurality of unit capacity cell blocks are arranged in the interstice between the input/output block and the function block or between the function blocks, so that a place for the arrangement of a decoupling capacitor constituted by the plurality of unit capacity cells can be easily held in the element region. Besides, since the arrangement of the first via-conductor and the second via-conductor is determined by the via-conductor arrangement unit, the semiconductor integrated circuit element can be easily designed so that the plurality of unit capacity cells, accordingly the decoupling capacitor, may be connected to the first power source wiring line and the second power source wiring line. Thus, the design system is permitted to easily design the semiconductor integrated circuit element having the decoupling capacitor. Besides, since the unit capacity cell blocks are employed, the decoupling capacitor which is suited to the shape of the interstice between the input/output block and the function block, or the like can be constructed with ease.

By the way, it is also possible for accomplishing the object to employ a program which causes a computer to function as the respective unit in the above design system of the semiconductor integrated circuit element.

According to this program, the computer can be caused to function as the respective unit in the foregoing design system of the semiconductor integrated circuit element, and the semiconductor integrated circuit element can be designed with ease.

Alternatively, it is also possible for accomplishing the object to employ a computer-readable program product in which a program for causing a computer to function as the respective unit in the above design system of the semiconductor integrated circuit element is held recorded.

According to this program product, it is facilitated to provide the program which can cause the computer to function as the respective unit in the foregoing design system of the semiconductor integrated circuit element.

Further, in order to accomplish the object, the design method of a semiconductor integrated circuit element according to still another aspect of the present invention consists in a method of designing a semiconductor integrated circuit element in an element region, comprising the input/output-block arrangement step of determining arrangement of an input/output block; the function-block arrangement step of determining arrangement of all function blocks which include an analog-signal-circuit block; the unit-capacity-cell arrangement step of arranging a plurality of unit capacity cell blocks in adjacency to each other in, at least, an interstice between the input/output block and the analog-signal-circuit block within that open region of the element region which does not belong to any of the input/output block and the function blocks; the unit capacity cell blocks symbolizing unit capacity cells each of which includes a unit capacitor composed of a first electrode to be set at a first power source potential, a dielectric layer, and a second electrode opposing to the first electrode through the dielectric layer and to be set at a second power source potential, and which have such a connection wiring pattern that, when the unit capacity cells are arranged in adjacency to each other, the first electrodes of the adjacent unit capacity cells can be electrically connected to each other, while the second electrodes thereof can be electrically connected to each other; the analog-wiring arrangement step of determining arrangement of wiring lines between the input/output block and the analog-signal-circuit block; and the via-conductor arrangement step of determining arrangement of at least one first via-conductor which is electrically connected with the first electrode while extending from at least one first power source wiring line to be set at the first power source potential, among the wiring lines, and at least one second via-conductor which is electrically connected with the second electrode while extending from at least one second power source wiring line to be set at the second power source potential, among the wiring lines.

According to this design method, the input/output block and the function blocks including the analog-signal-circuit block are arranged, and the plurality of unit capacity cell blocks are arranged in the interstice between the input/output block and the analog-signal-circuit block, so that a place for the arrangement of a decoupling capacitor constituted by the plurality of unit capacity cells can be easily held in the semiconductor integrated circuit element, especially in the interstice between the input/output block and the analog-signal-circuit block. Besides, since the arrangement of the first via-conductor and the second via-conductor is determined by the via-conductor arrangement step, the semiconductor integrated circuit element can be easily designed so that the plurality of unit capacity cells, accordingly the decoupling capacitor, may be connected to the first power source wiring line and the second power source wiring line. Thus, the design method is permitted to easily design the semiconductor integrated circuit element having the decoupling capacitor. Besides, since the decoupling capacitor based on the unit capacity cell blocks is arranged in the interstice between the input/output block and the analog-signal-circuit block, the stable operation of especially the analog-signal-circuit block can be attained by the semiconductor integrated circuit element designed. Besides, since the unit capacity cell blocks are employed, the decoupling capacitor which is suited to the shape of the interstice between the input/output block and the analog-signal-circuit block, or the like can be constructed with ease.

Further, in order to accomplish the object, the design method of a semiconductor integrated circuit element according to yet another aspect of the present invention consists in a method of designing a semiconductor integrated circuit element in an element region, comprising the input/output-block arrangement step of determining arrangement of an input/output block; the function-block arrangement step of determining arrangement of all function blocks; the unit-capacity-cell arrangement step of arranging a plurality of unit capacity cell blocks in adjacency to each other in an interstice between the input/output block and the function block or in an interstice between the function blocks within that open region of the element region which does not belong to any of the input/output block and the function blocks; the unit capacity cell blocks symbolizing unit capacity cells each of which includes a unit capacitor composed of a first electrode to be set at a first power source potential, a dielectric layer, and a second electrode opposing to the first electrode through the dielectric layer and to be set at a second power source potential, and which have such a connection wiring pattern that, when the unit capacity cells are arranged in adjacency to each other, the first electrodes of the adjacent unit capacity cells can be electrically connected to each other, while the second electrodes thereof can be electrically connected to each other; the wiring arrangement step of determining arrangement of wiring lines between the input/output block and the function block and wiring lines between the function blocks; and the via-conductor arrangement step of determining arrangement of at least one first via-conductor which is electrically connected with the first electrode while extending from at least one first power source wiring line to be set at the first power source potential, among the wiring lines, and at least one second via-conductor which is electrically connected with the second electrode while extending from at least one second power source wiring line to be set at the second power source potential, among the wiring lines.

According to this design method, the input/output block and the function blocks are arranged, and the plurality of unit capacity cell blocks are arranged in the interstice between the input/output block and the function block or between the function blocks, so that a place for the arrangement of a decoupling capacitor constituted by the plurality of unit capacity cells can be easily held in the semiconductor integrated circuit element. Besides, since the arrangement of the first via-conductor and the second via-conductor is determined by the via-conductor arrangement step, the semiconductor integrated circuit element can be easily designed so that the plurality of unit capacity cells, accordingly the decoupling capacitor, may be connected to the first power source wiring line and the second power source wiring line. Thus, the design method is permitted to easily design the semiconductor integrated circuit element having the decoupling capacitor. Besides, since the unit capacity cell blocks are employed, the decoupling capacitor which is suited to the shape of the interstice between the input/output block and the function block, or the like can be constructed with ease.

Further, in order to accomplish the object, a semiconductor integrated circuit element according to another aspect of the present invention consists in a semiconductor integrated circuit element which is formed on a substrate, and which has an input/output block and a plurality of function blocks partitioned in a direction of a plane of the substrate, comprising a plurality of unit capacity cells which are arranged in adjacency to each other within an open region that does not belong to any of the input/output block and the function blocks; each of the unit capacity cells including a unit capacitor which is composed of a first electrode to be set at a first power source potential, a dielectric layer, and a second electrode opposing to the first electrode through the dielectric layer and to be set at a second power source potential; the unit capacity cells having such a connection wiring pattern that, when the unit capacity cells are arranged in adjacency to each other in the direction of the plane, the first electrodes of the adjacent unit capacity cells can be electrically connected to each other, while the second electrodes thereof can be electrically connected to each other; the first electrodes and the second electrodes of the adjacent unit capacity cells being electrically connected to each other, respectively.

According to this semiconductor integrated circuit element, the plurality of unit capacity cells are arranged in adjacency to each other within the open region. The unit capacity cells can have their first electrodes and second electrodes electrically connected to each other, respectively, between the adjacent unit capacity cells. Therefore, when the first electrode of any of the unit capacity cells is connected to the first power source potential, the first electrodes of all the adjacent unit capacity cells can be set at the first power source potential. Likewise, when the second electrode of any of the unit capacity cells is connected to the second power source potential, the second electrodes of all the adjacent unit capacity cells can be set at the second power source potential. Accordingly, the positions of connections with the first and second power source potentials are easily selected. Moreover, since the plurality of unit capacity cells can be arranged in accordance with the shape of the open region, the semiconductor integrated circuit element can be designed easily without requiring a skill. Therefore, the cost of manufacture can be curtailed to make the semiconductor integrated circuit element inexpensive. Besides, since the arrangement of the unit capacity cells can be adjusted so as to be suited to the shape of the open region, the whole open region can be effective utilized to endow the element with a decoupling capacitor of large electrostatic capacitance.

DETAILED DESCRIPTION OF THE PREFERRED EMBODIMENTS (Embodiments)

Figure 1:
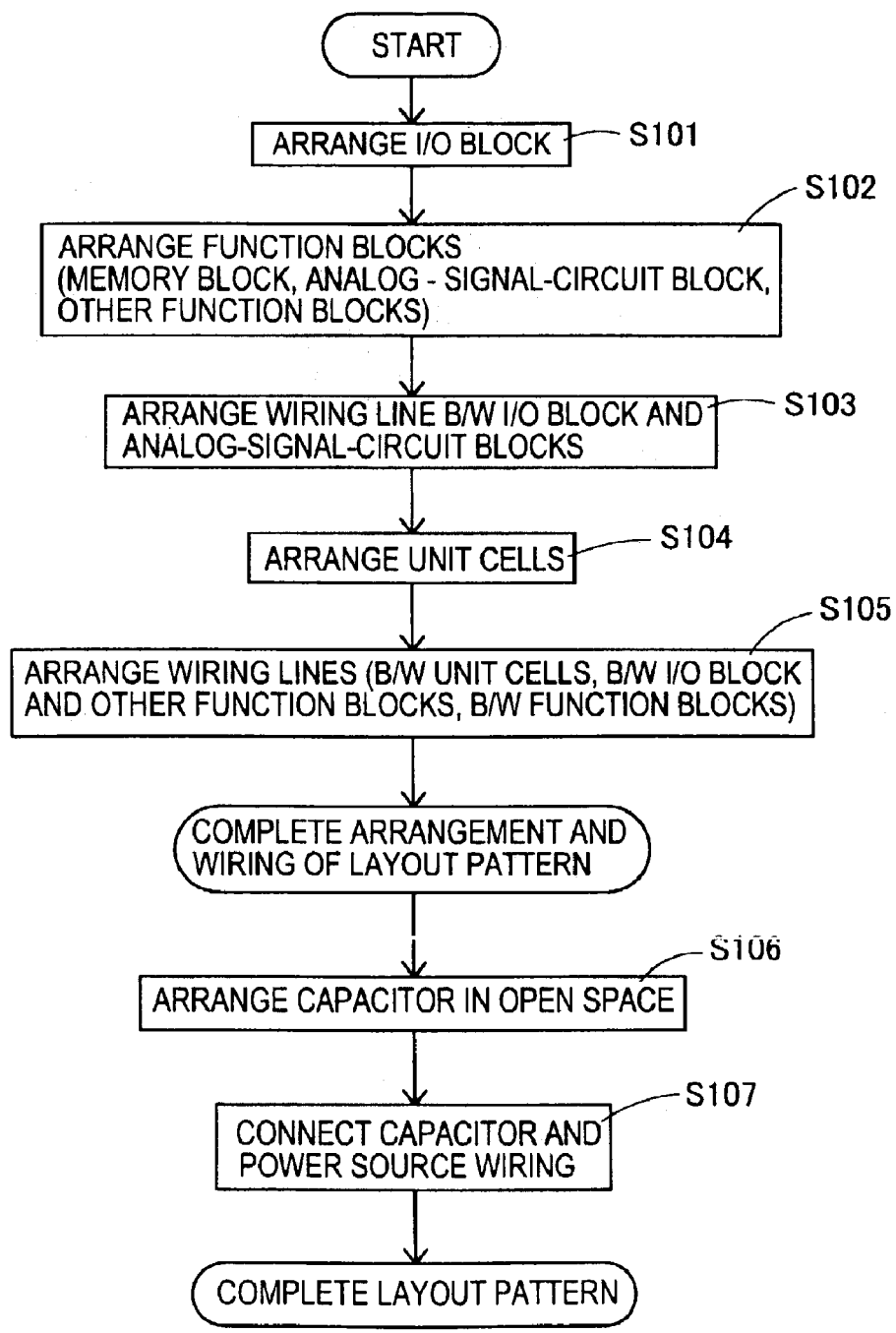
FIG. 1 is a flow chart showing the design procedure of an IC chip in the related art.
Figure 2:
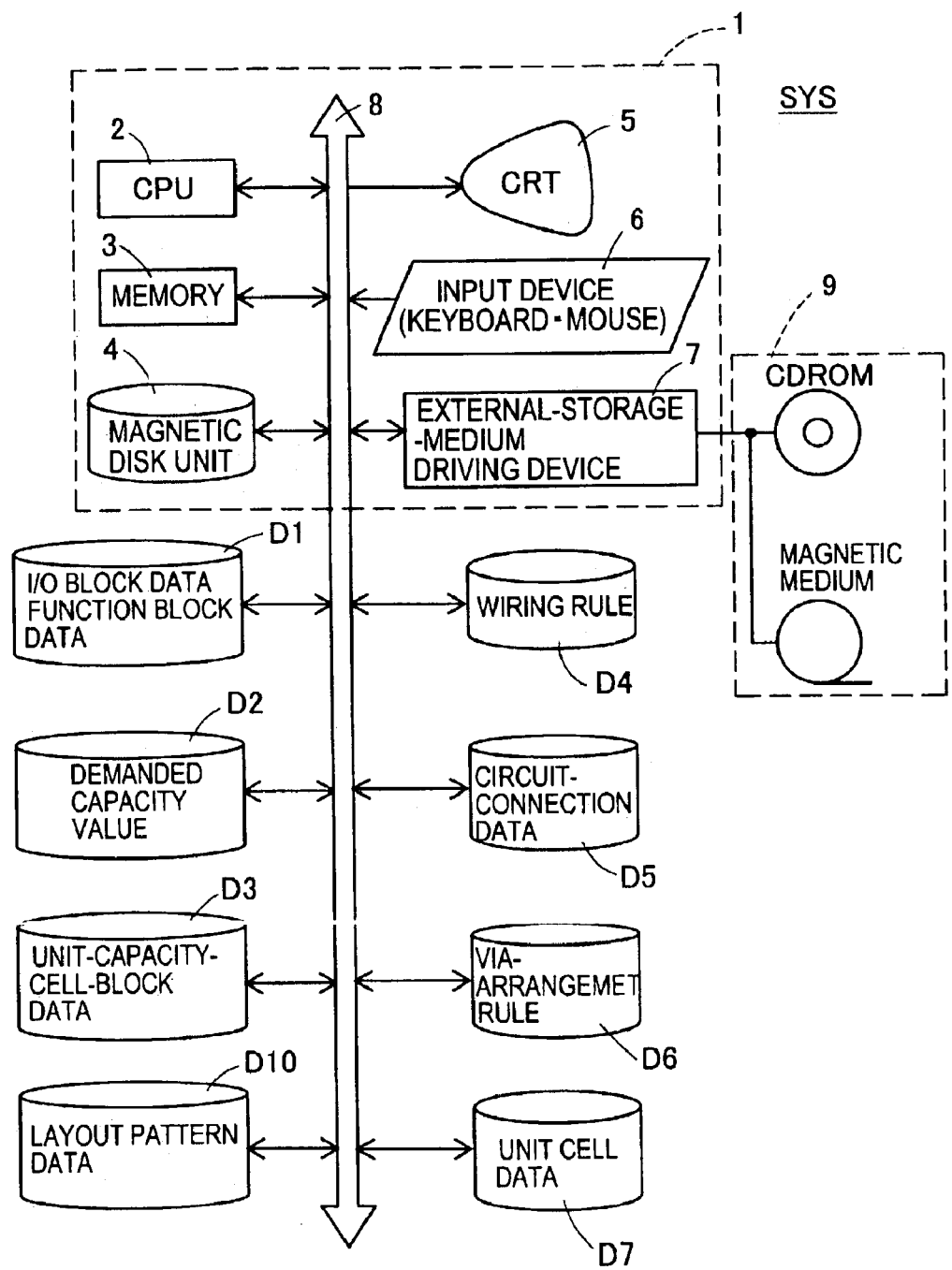
FIG. 2 is an architectural diagram of the design system of an IC chip in an embodiment, etc.
Figure 3:
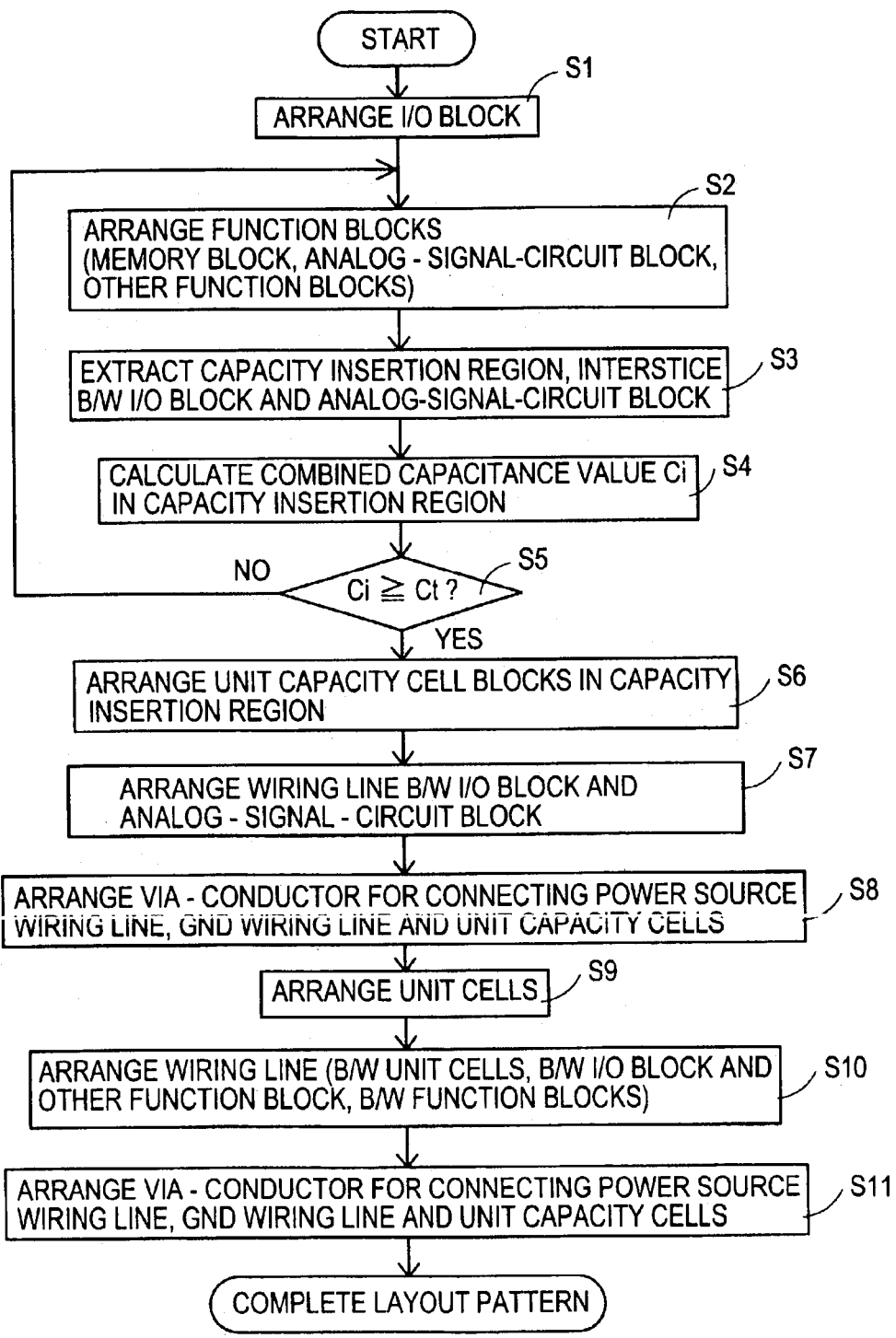
FIG. 3 is a flow chart showing the design procedure of the IC chip in the embodiment.

An embodiment of the present invention will be described with reference to FIGS. 2–15. FIG. 2 is an architectural diagram of a design system for designing an IC chip 100. FIG. 3 is a flowchart showing the design procedure of the IC chip 100. Besides, FIGS. 4–15 are explanatory diagrams for explaining the structures of the IC chip 100 and a unit capacity cell block 10 as correspond to the individual stages of the design. In this embodiment, the design system and design method of the IC chip 100 will be described in conjunction with the architectural diagram of FIG. 2, the flow chart of FIG. 3, and the explanatory diagrams of FIGS. 4–15 corresponding to the steps of the flow chart.

First, the architecture of the design system SYS shown in FIG. 2 will be described. This design system SYS is incarnated in such a way that a computer 1 which includes a CPU 2, and a memory 3, a magnetic disk unit 4, a display device (hereinbelow, also termed "CRT") 5, an input device 6 such as keyboard or mouse, and an external-storage-medium driving device 7 such as CD-ROM drive that are connected to the CPU 2 through a bus 8, is caused to function in accordance with a program. An external storage medium 9 such as CD-ROM or magnetic medium is unloadably loaded into the external-storage-medium driving device 7.

A program which implements a design processing flow shown in FIG. 3 is held recorded in the memory 3 or magnetic disk unit 4 within the computer 1 and is sometimes held recorded in the external storage medium 9 such as CD-ROM or magnetic medium, and it is transferred to the CPU 2 directly or after being once recorded in the memory 3 or magnetic disk unit 4 through the external-storage-medium driving device 7, whereupon it is run. Besides, various data files D1–D7 as shown in the lower part of FIG. 2 are held recorded in the memory 3 or magnetic disk unit 4 or in the external storage medium 9, and they are referred to by a command from the CPU 2 in accordance with the processing of the above program as may be needed. Further, the layout pattern data of the IC chip 100 generated by the run of the program is recorded in the magnetic disk unit 4 or the like as a data file D10, and it is utilized for the manufacture of the IC chip 100.

Figure 4:
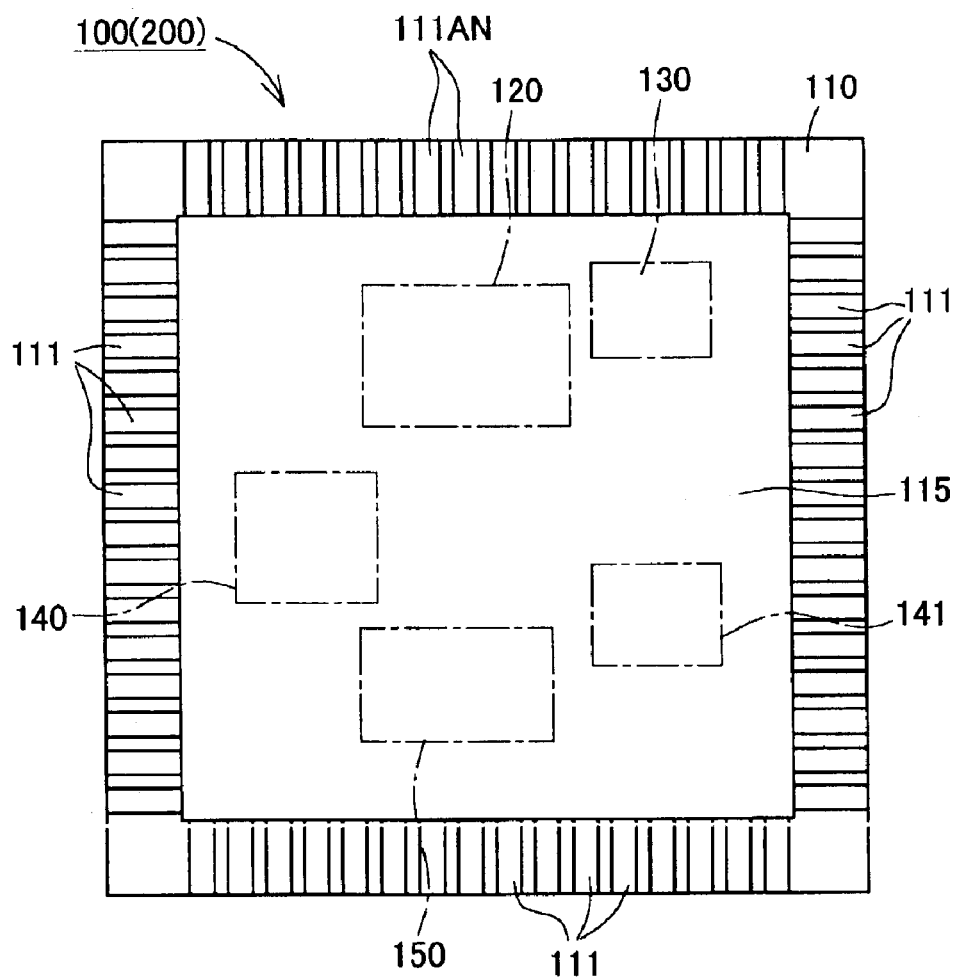
FIG. 4 is an explanatory diagram showing a state where an input/output block, analog-signal-circuit blocks, memory blocks, a CPU core and other function blocks are arranged on the IC chip.

Now, the processing will be concretely described with reference to the flowchart shown in FIG. 3. First, at a step S1, an input/output block 110 is arranged at the peripheral edge area of an element region which is to become the IC chip 100. On this occasion, the data of the input/output block 110 recorded in the data file D1 is employed. As shown in FIG. 4, the input/output block 110 is formed at the peripheral edge of the IC chip 100, and it includes input/output terminal sections 111 which serve as contact pads for wire bonding connections with a substrate or the like for carrying the IC chip 100 thereon. Incidentally, as will be stated later, the input/output terminal sections 111 include analog input/output terminal sections 111AN for connecting analog-signal-circuit blocks 120, 130 with the exterior.

Further, at a step S2, individual function blocks are arranged. Each of the function blocks is a block which demonstrates one definite function. More specifically, as shown in FIG. 4, the function blocks, for example, the analog-signal-circuit blocks 120, 130 in which an A/D converter as well as a D/A converter and other analog-signal processing circuits are to be formed, memory blocks 140, 141 in which memories such as a DRAM and an SRAM are to be formed, and a CPU core 150 in which a CPU is to be formed, are arranged in a region which is enclosed with the input/output block 110. Also on this occasion, the data of the function blocks recorded in the data file D1 is employed. Incidentally, the arrangement here is not determination, but is tentative arrangement as will be stated later.

Figure 5:
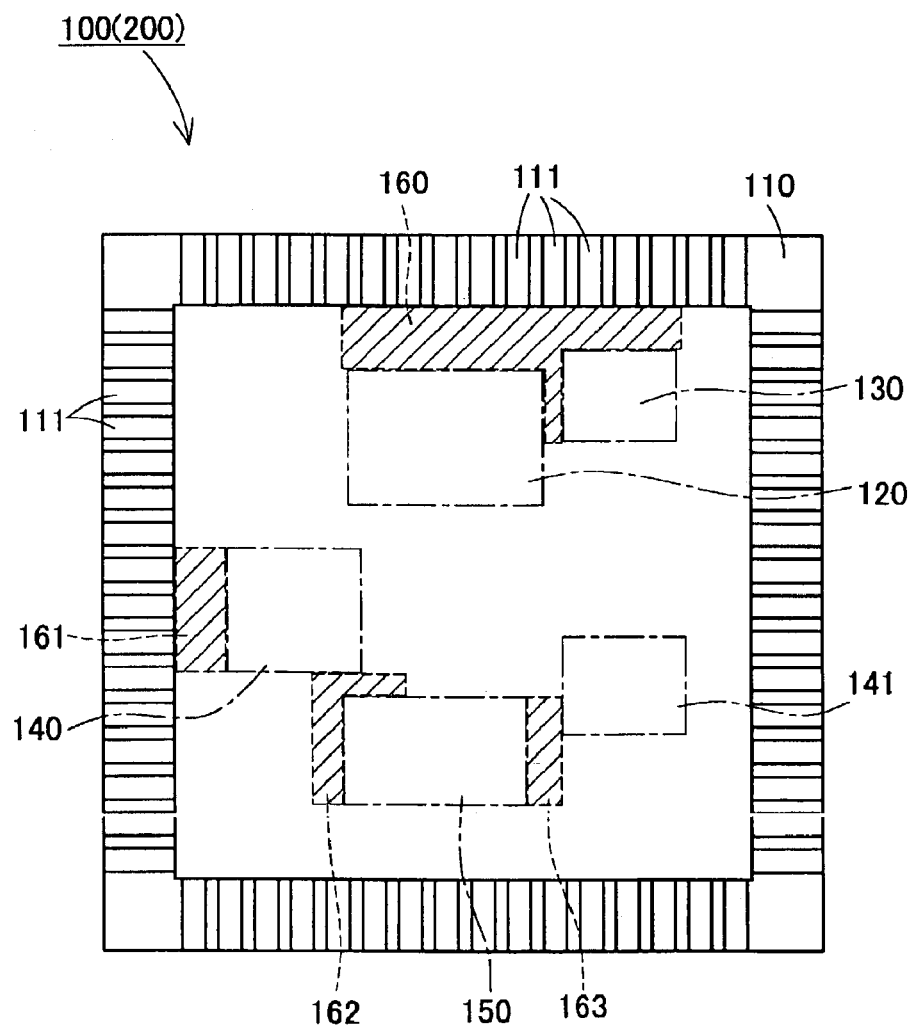
FIG. 5 is an explanatory diagram showing a state where a large number of unit capacity cell blocks are arranged in adjacency to one another in that open region of the IC chip in which the function blocks are not arranged.

Subsequently, at a step S3, as shown in FIG. 5, hatched capacity insertion regions 160, 161, 162, 163 such as the interstices between the input/output block 110 and the analog-signal-circuit blocks 120, 130 or the other function blocks (the memory blocks 140, 141 and the CPU core 150), are extracted from an open region 115 (refer to FIG. 4) which is occupied by none of the input/output block 110, the function block 120, etc.

Subsequently, at a step S4, the combined capacitance values Ci of capacitors which are obtained under the assumption that unit capacity cells 10a be arrayed in the capacity insertion regions 160 etc. are respectively calculated from the areas etc. of these regions.

At a step S5, the combined capacitance values Ci are compared with corresponding demanded capacitance values Ct which are respectively determined in accordance with the functions etc. of the analog-signal-circuit blocks 120, 130 and the function blocks 140, 141. The demanded capacitance values Ct are held recorded in the data file D2. Here, in a case where the combined capacitance value Ci is smaller than the corresponding demanded capacitance value Ct, the routine returns to the step S2. That is, the function blocks of the analog-signal-circuit block 120, etc. are arranged again (step S2), the capacity insertion regions are extracted (step S3), and the combined capacitance values Ci are calculated (step S4). In this way, the function blocks are arranged so that the combined capacitance values Ci may become same as or larger than the corresponding demanded capacitance values Ct. In a case where the combined capacitance values Ci have become same as or larger than the corresponding demanded capacitance values Ct, the routine proceeds to a step S6. Thus, the arrangement of the function blocks of the analog-signal-circuit block 120, etc. has been determined.

Thereafter, at the step S6, unit capacity cell blocks 10 each of which is shaped rectangular when viewed in plan are arranged so as to be spread all over the capacity insertion regions 160 etc., by employing the data of these unit capacity cell blocks recorded in the data file D3.

Figure 6:
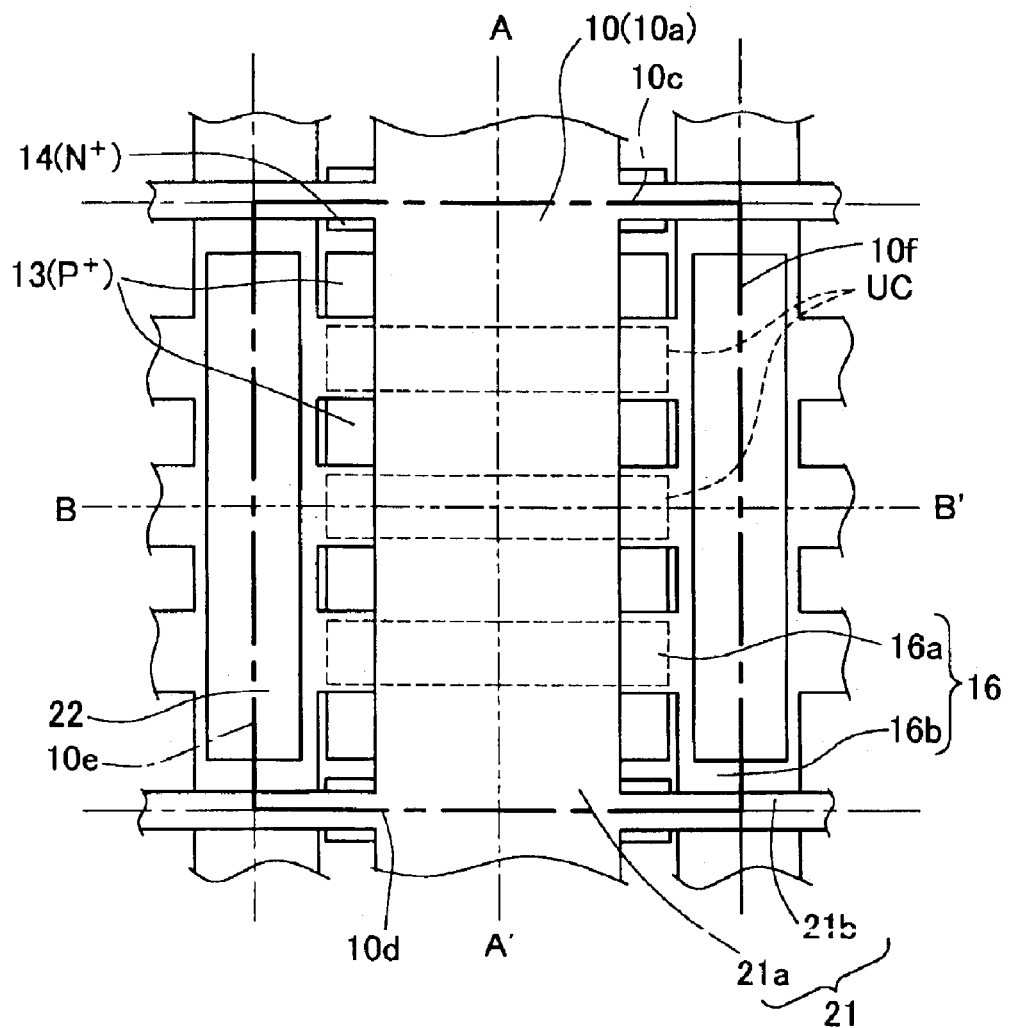
FIG. 6 is an explanatory view showing the plan structure of a unit capacity cell.
Figure 7:
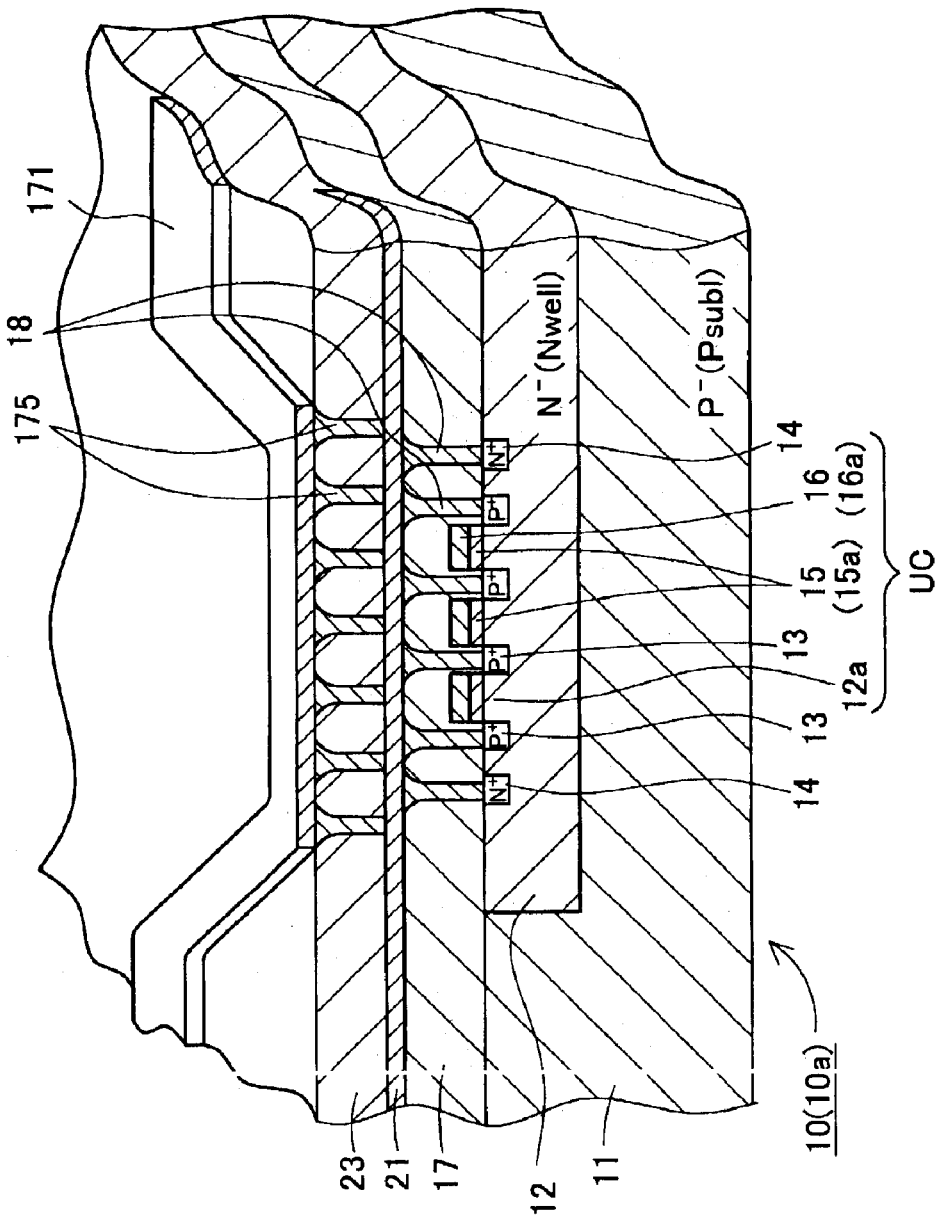
FIG. 7 is an explanatory view showing the structure of the unit capacity cell taken along a section A–A' in FIG. 6.
Figure 8:
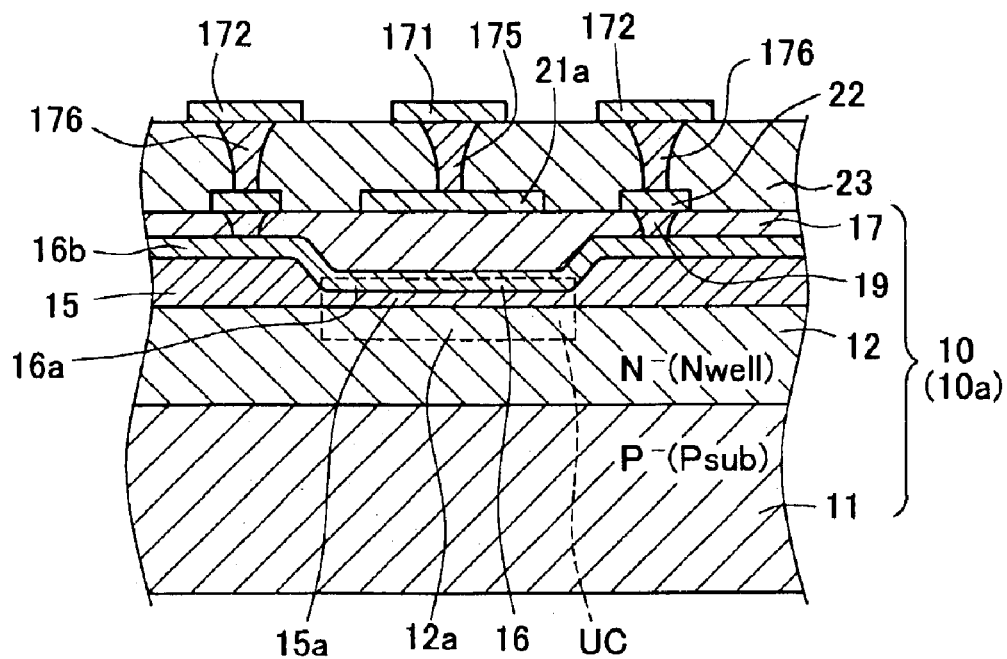
FIG. 8 is an explanatory view showing the structure of the unit capacity cell taken along a section B–B' in FIG. 6.
Figure 9:
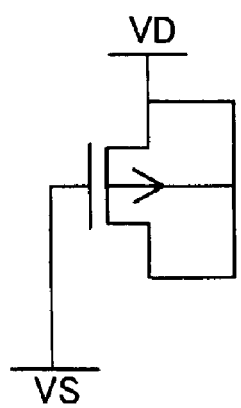
FIG. 9 is an explanatory diagram schematically showing the circuit arrangement of the unit capacity cell.

The structure of the unit capacity cell 10a which is actually formed and arranged in the unit capacity cell block 10 is shown in FIGS. 6–9. FIG. 6 is a plan view of the unit capacity cell 10a as viewed from the front surface side thereof, while FIG. 7 is a sectional view of a section A–A' in FIG. 6. Besides, FIG. 8 is a sectional view of a section B–B' in FIG. 6. Further, FIG. 9 is a diagram schematically showing the structure of the unit capacity cell 10a.

As shown in FIG. 6, the unit capacity cell 10a has a shape which extends in the shape of a rectangle (of, for example, 20 $\mu$m-square or so) in the direction of the plane of the IC chip 100. This unit capacity cell 10a forms a unit capacitor by utilizing the structure of a MOS transistor (MOSFET). More specifically, as shown in FIGS. 7 and 8, an $N^-$-doped well 12 is formed in a $P^-$-doped silicon substrate 11. Further, in the vicinity of the front surface of the well 12, $P^+$ diffusion areas 13 being $P^+$-doped (in this embodiment, four regions per unit capacity cell 10a) and $N^+$ diffusion areas 14 being $N^+$-doped (in this embodiment, two regions per unit capacity cell 10a) are formed in correspondence with the source and drain of the MOSFET. Besides, each channel area (first electrode) 12a held between the $P^+$ diffusion areas 13 in the well 12 is overlaid with a gate oxide film 15a having a very small thickness as determined by a CMOS process, in an oxide film 15 made of $SiO_2$, and the gate oxide film 15a is overlaid with a gate section (second electrode) 16a in a poly-silicon layer 16. Further, a connection portion 21a centrally located in lateral direction and extending in a vertical direction in FIG. 6, in a VD metal layer 21 which is made of aluminum, which overlies an oxide film 17 formed on the front surface of the well 12 and which is connected to a first power source potential (power source potential) VD, is connected with the $P^+$ diffusion areas 13 and the $N^+$ diffusion areas 14 by respective via-conductors 18 which penetrate the oxide film 17. Besides, in lead-out portion 16b in the poly-silicon layer 16, and the gate sections 16a are connected to a VS metal layer 22 which is made of aluminum, which overlies the oxide film 17 and which is connected to a second power source potential (ground potential) VS, by via-conductors 19 which penetrate the oxide film 17. The lead-out portion 16b of the poly-silicon layer 16 extends in the vertical direction and leads out the gate sections 16a in a lateral direction as viewed in FIG. 6.

In this way, the gate oxide films 15a are held between the gate sections 16a and the channel areas 12a as shown in FIGS. 6–8, whereby capacitors UC are formed.

That is, as schematically shown in FIG. 9, the unit capacity cell 10a has such a structure that the three capacitors UC are formed in parallel by short-circuiting the three of the source, the drain and a back gate in the MOSFET and holding the gate oxide films 15a as dielectric layers between the three and the gate of the MOSFET. Accordingly, a state is brought forth where a capacitor (decoupling capacitor) is inserted between the power source potential VD and the ground potential VS through the VD metal layer 21 and the VS metal layer 22.

The unit capacity cell 10a has the advantage that, since the ultrathin gate oxide films 15a are employed as the dielectric layers, a large electrostatic capacitance can be ensured. Moreover, since the manufacturing process of the MOSFET is an already established technique, the capacitor can be manufactured more easily and at a higher yield than in case of forming it by another process. Furthermore, since the unit capacity cell 10a can be formed simultaneously with the manufacture of MOSFETs at the other parts of the IC chip 100, a manufactural burden ascribable to the separate formation of this unit capacity cell 10a is not involved to make the capacitor inexpensive.

Incidentally, the VD metal layer 21 includes in addition to the connection portion 21a, lead-out portions 21b which laterally extend from the connection portion 21a at the upper and lower sides of the unit capacity cell 10a as viewed in FIG. 6.

Besides, states where the VD metal layer 21 and the VS metal layer 22 are overlaid with an oxide film 23 and VD wiring 171 as well as VS wiring 172 are shown in FIGS. 7 and 8, and such constituents will be explained later.

As shown in FIG. 6, in the rectangular-shaped unit capacity cell 10a, the VD metal layer 21 is arranged all over the upper side 10c and lower side 10d by the connection portion 21a and the lead-out portions 21b. Besides, the lead-out portion 16b of the poly-silicon layer 16 is led out to the left end and right end of each of the upper side 10c and lower side 10d. Further, the VD metal layer 21 is led out to the upper end and lower end of each of the left side 10e and right side 10f of the unit capacity cell 10a by the lead-out portions 21b. Besides, the VS metal layer 22 is arranged at the central part of each of the left side 10e and right side 10f, and the lead-out portion 16b of the poly-silicon layer 16 is arranged over the whole sides. That is, the channel areas 12a are electrically led out to the four sides by the VD metal layer 21. Besides, the gate sections 16a are electrically led out to the four sides by the lead-out portion 16b of the poly-silicon layer 16 and the VS metal layer 22.

Moreover, when the VD metal layer 21, the lead-out portion 16b of the poly-silicon layer 16 and the VS metal layer 22 are viewed, they have a shape of vertically symmetric relation between the upper side 10c and the lower side 10d and a shape of laterally symmetric relation between the left side 10e and the right side 10f. That is, the VD metal layer 21 led out from the channel areas 12a, and the VS metal layer 22 led out from the gate sections 16a or the lead-out portion 16b of the poly-silicon layer 16 lie in relationships of mirror images between the upper side 10c and the lower side 10d and between the left side 10e and the right side 10f.

Figure 10:
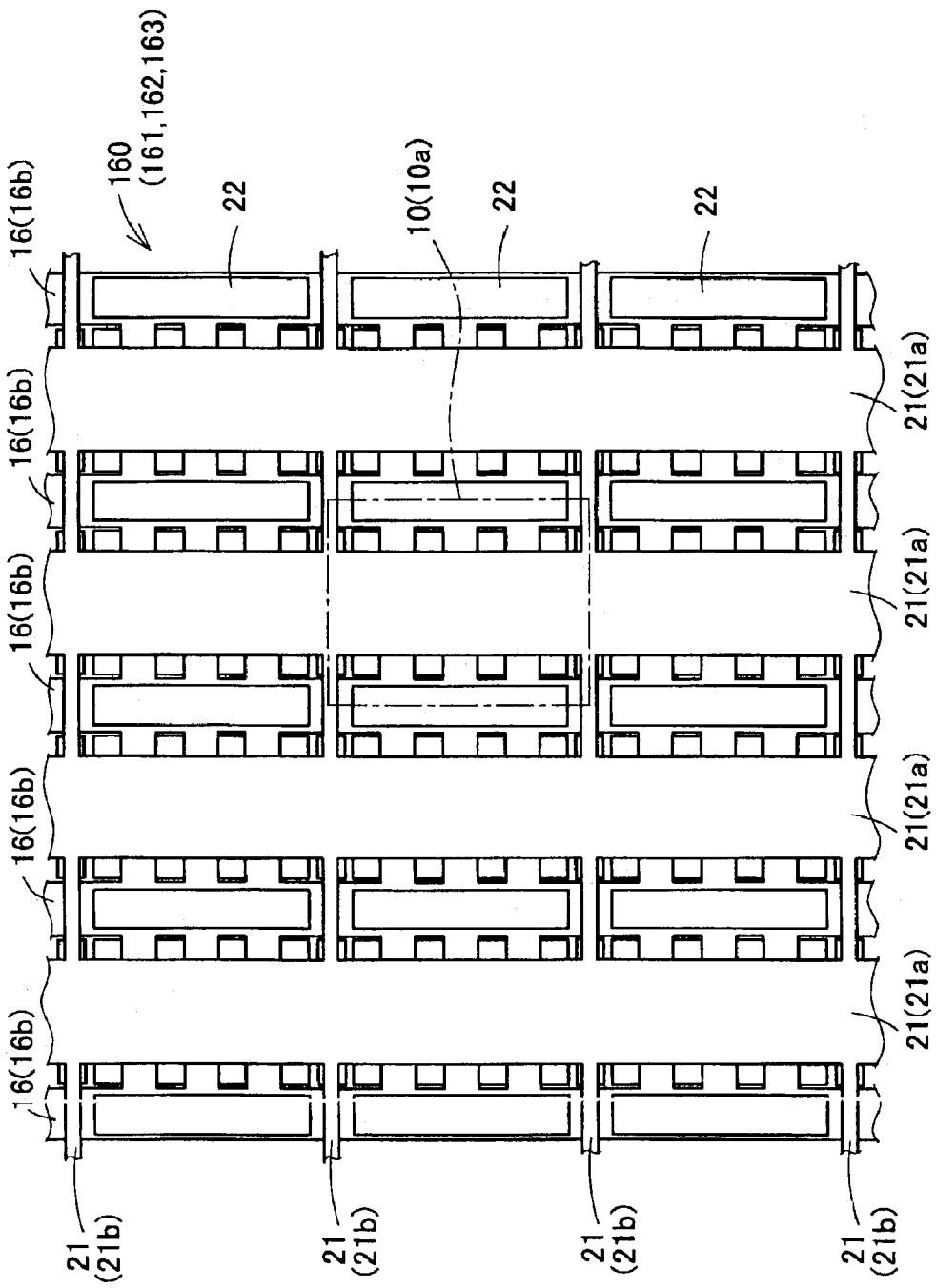
FIG. 10 is an explanatory view showing a state where a plurality of unit capacity cells are arranged in a latticed pattern so as to be adjacent to one another.

Therefore, when the unit capacity cells 10a as shown in FIG. 6 are arranged in a latticed pattern so as to be adjacent to one another, the VD metal layers 21 are connected to one another, and the lead-out portions 16b of the poly-silicon layers 16 are also connected to one another, as shown in FIG. 10. Thus, a state is brought forth where the large number of unit capacity cells 10a are connected in parallel, and a capacitor having a large combined capacitance can be formed. Moreover, with such a structure, when the VD metal layer 21 is connected to the power source potential VD in at least one of the large number of unit capacity cells 10a arrayed in adjacency, all the unit capacity cells 10a can be connected to the power source potential VD. Likewise, when the VS metal layer 22 is connected to the ground potential VS in at least one unit capacity cell 10a, all the unit capacity cells 10a can be connected to the ground potential VS.

As stated before, the unit capacity cell blocks 10 corresponding to the unit capacity cells 10a of such a structure are arranged in the capacity insertion regions 160 etc. so as to be spread all over these regions in a latticed pattern. Thus, the capacitors each having the large combined capacitance value Ci are respectively arranged in the capacity insertion regions 160 etc.

Figure 11:
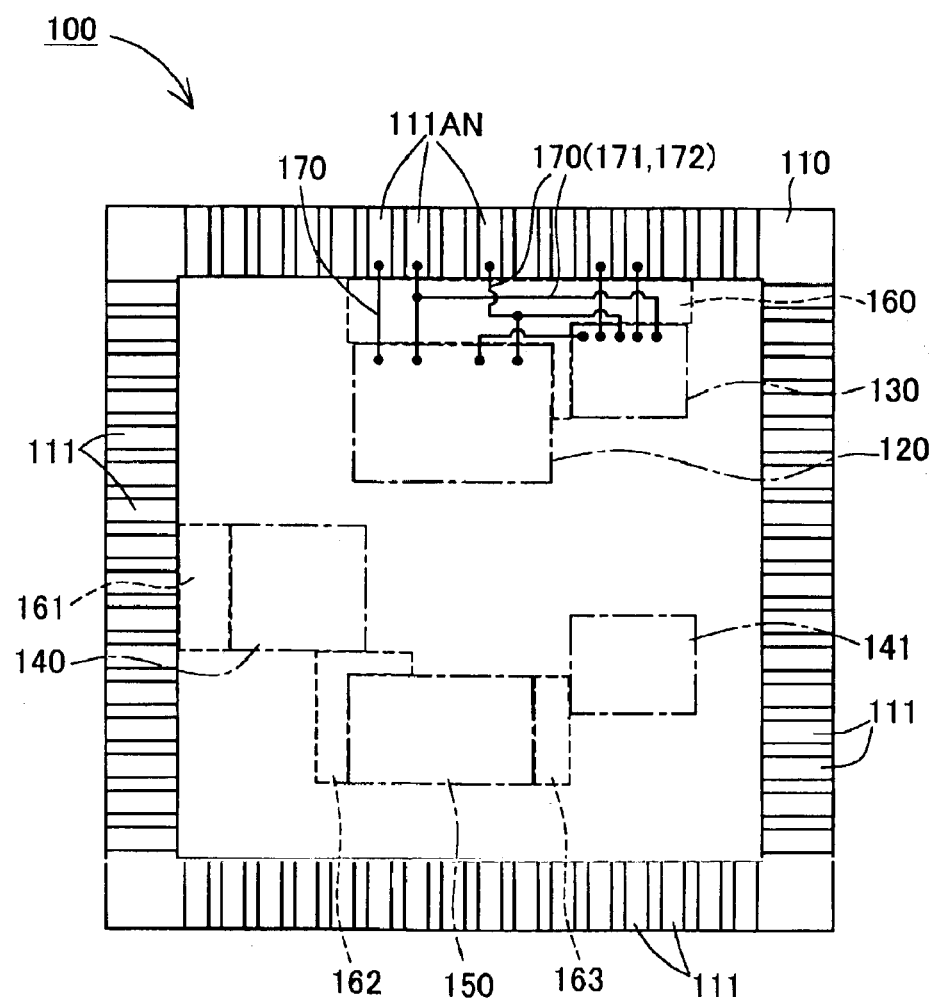
FIG. 11 is an explanatory view showing a state where wiring lines are formed between the input/output block and the analog-signal-circuit blocks in the IC chip.

Referring back to FIG. 3, at the next step S7, the arrangement of analog wiring lines 170 which are to be laid between the analog input/output terminal sections 111AN of the input/output block 110 and the analog-signal-circuit blocks 120, 130 as shown in FIG. 11 is determined on the basis of wiring rules recorded in the data file D4 and circuit connection data recorded in the data file D5. This step is necessary for the reason that, since the distortions of signal waveforms, etc. ascribable to the line lengths, characteristic impedances etc. of the wiring lines to transmit analog signals affect subsequent processing greatly, the locations and dimensions of the wiring lines should preferably be carefully determined so as to obtain the optimum wiring lines. The analog wiring lines 170 also include VD wiring (power source wiring) lines 171 and VS wiring (ground wiring) lines 172 for supplying power to the analog-signal-circuit blocks 120, 130. Incidentally, if necessary, a designer can lay the analog wiring lines 170 by manual work or can make manual corrections after the automatic wiring operation.

Figure 12:
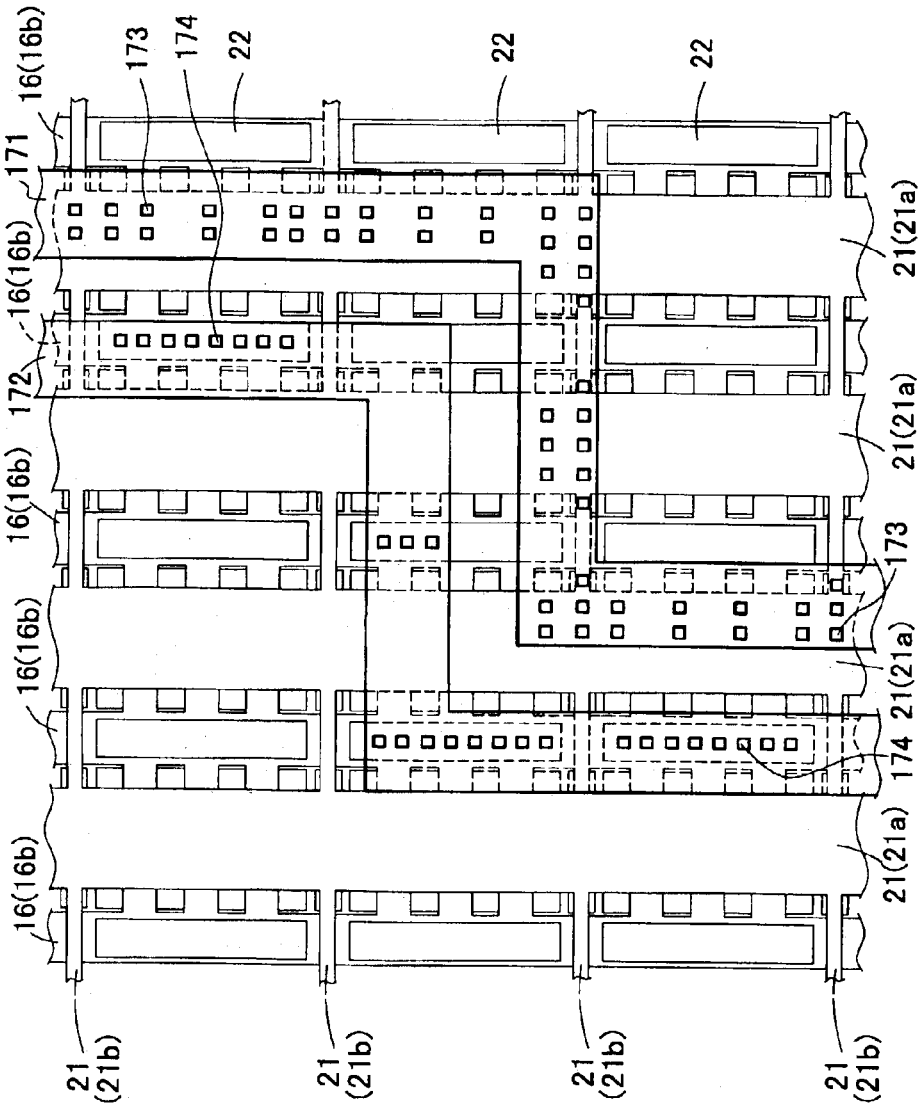
FIG. 12 is an explanatory view showing a state where via-conductors are arranged between VD wiring lines as well as VS wiring lines and the unit capacity cells.

Subsequently, at a step S8, as shown in FIG. 12, a large number of VD via-conductors 173 are arranged within parts where the VD metal layers 21 and the VD wiring lines 171 overlap each other as viewed in the thickness direction of the IC chip 100, on the basis of via-arrangement rules recorded in the data file D6. Besides, a large number of VS via-conductors 174 are arranged within parts where the VS metal layers 22 and the VS wiring lines 172 overlap each other.

Concretely, the actual unit capacity cell 10a and the VD wiring lines 171 and VS wiring lines 172 overlying it are connected as shown in FIGS. 7 and 8. More concretely, the oxide film 23 is formed on the oxide film 17 and the VD metal layer 21 and VS metal layer 22, and the metal layers 21 and 22 are respectively connected with the VD wiring lines 171 and VS wiring lines 172 formed on the oxide film 23, by the VD via-conductors 173 and VS via-conductors 174 which penetrate the oxide film 23.

Thus, the VD wiring lines 171 and VS wiring lines 172 can be arranged irrespective of the unit capacity cell 10a underlying them in the thickness direction, so that the arrangement is facilitated. Conversely, since the VD wiring lines 171 and VS wiring lines 172 are formed over the unit capacity cell 10a in the thickness direction, the unit capacity cell 10a can be arranged without exerting influence on the VD wiring lines 171 and VS wiring lines 172. Moreover, it suffices to merely connect the VD metal layer 21 and VD wiring lines 171 and the VS wiring lines 172 and VS metal layer 22 by the VD via-conductors 173 and the VS via-conductors 174, respectively, and hence, the connections are easy. Besides, the capacitor constructed of the unit capacity cells 10a can be connected to the power source potential and the ground potential with low resistances. In addition, the decoupling capacitor can be inserted between the VD wiring line 171 and the VS wiring line 172 among the analog wiring lines 170, near the analog-signal-circuit blocks 120, 130 and between the analog-signal-circuit blocks 120, 130 and the input/output block 110, so that the influence of noise, etc. can be eliminated to make the characteristics of the analog-signal-circuit blocks 120, 130 still better. Besides, as already explained, the VD metal layers 21, and the VS metal layers 22 and poly-silicon layers 16 are interconnected by the unit capacity cells 10a adjacent to each other, so that the VD metal layers 21, and the VS metal layers 22 and poly-silicon layers 16 can be respectively made the power source potential and the ground potential as to all the unit capacity cells 10a adjacent to each other.

Figure 13:
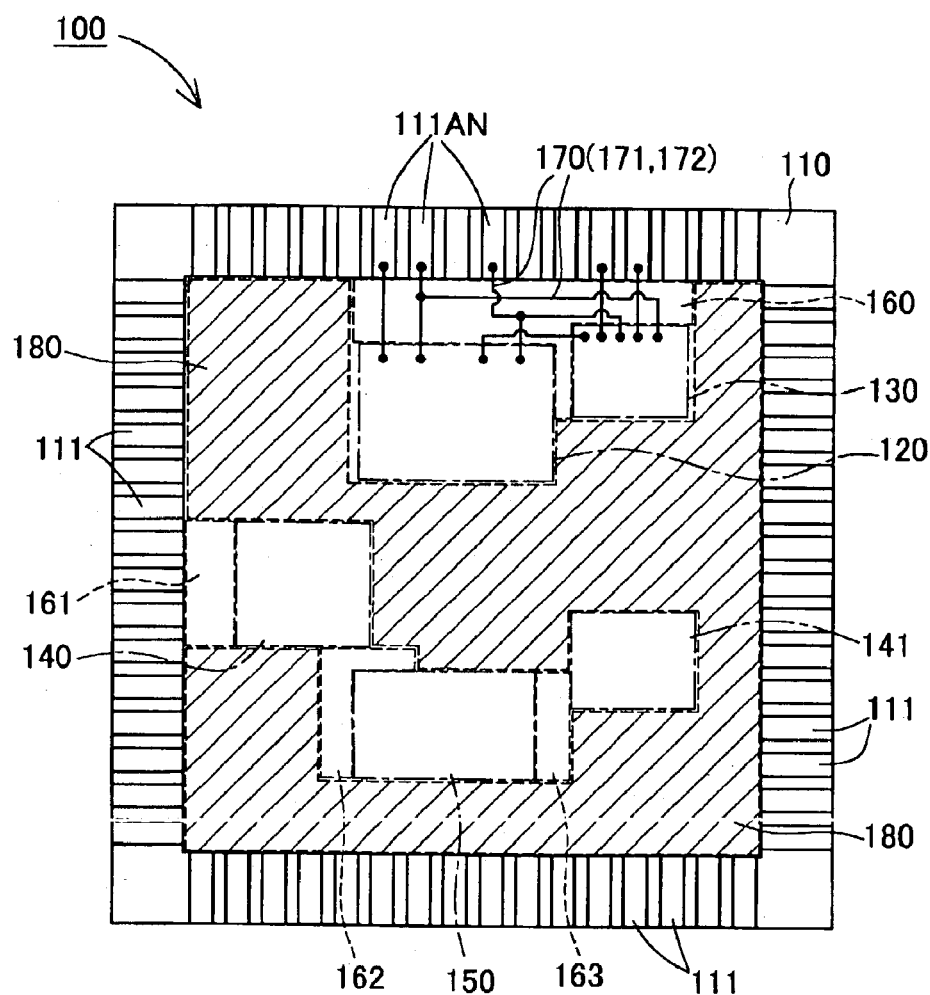
FIG. 13 is an explanatory view showing a state where unit cells are arranged in that open region of the IC chip in which the function blocks and the unit capacity cell blocks are not arranged.

Thereafter, at a step S9, as shown in FIG. 13, a large number of unit cells 180 in each of which a logic circuit, such as NAND circuit, NOR circuit, inverter or flip-flop, is unitarily formed, are arranged in a hatched region which is not occupied by any of the input/output block 110 and the function blocks such as analog-signal-circuit blocks 120, 130, the capacity insertion regions 160, 161, 162, 163, etc. The data of the unit cells 180 is held recorded in the data file D7.

Figure 14:
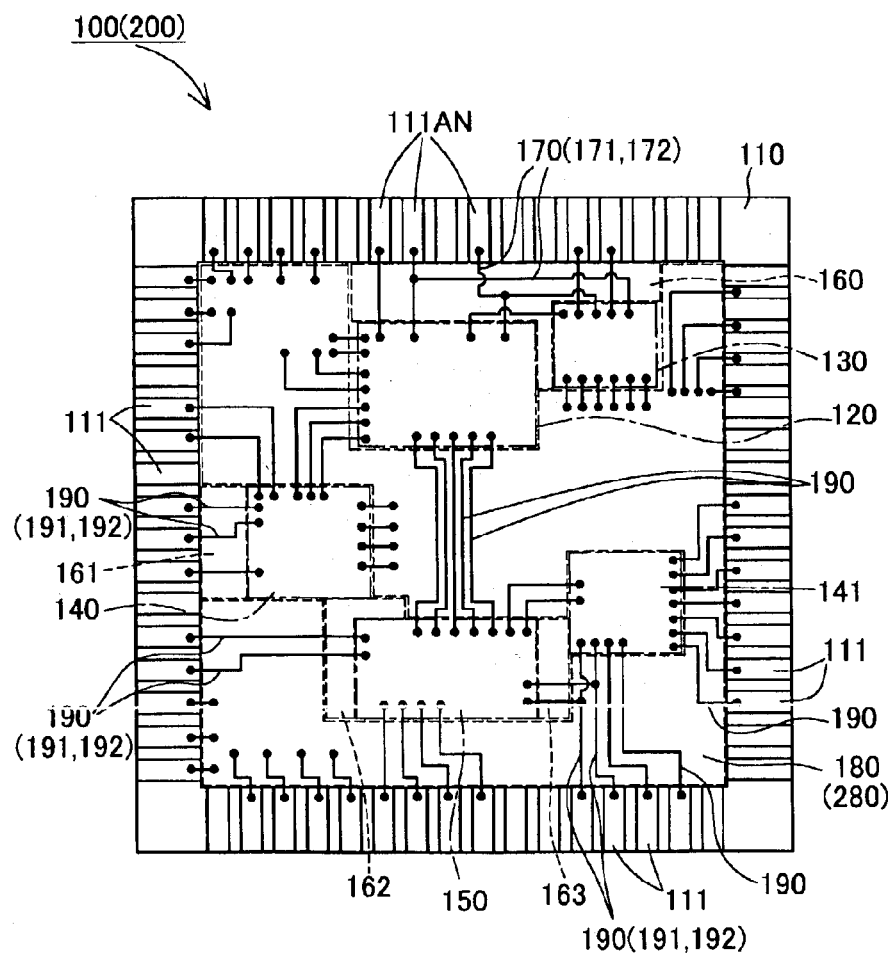
FIG. 14 is an explanatory view showing a state where the wiring lines are formed between the function blocks such as between the input/output block and the memory blocks, the CPU core and other function blocks and between the analog-signal-circuit blocks and the CPU core and memory blocks, between the function blocks and the unit cells, and so forth in the IC chip.

Thereafter, at a step S10, wiring lines 190 are arranged on the basis of the wiring rules recorded in the data file D4 and the circuit connection data recorded in the data file D5. More specifically, as shown in FIG. 14, the wiring lines 190 are arranged for the connections between the unit cells 180, between the input/output block 110 (concretely, input/output terminal sections 111) and the unit cells 180, between the input/output block 110 and the other function blocks such as memory blocks 140, 141 and CPU core 150, between the function blocks such as analog-signal-circuit blocks 120, 130 and memory blocks 140, 141 or CPU core 150, and so forth.

The wiring lines 190 include power source wiring lines 191 and ground wiring lines 192 which serve to supply electric power (the power source potential and the ground potential) for digital processing at various parts. Therefore, the arrangement of the power source wiring lines 191 and the ground wiring lines 192 is followed by a step S11, at which as in the foregoing case of the unit capacity cells 10a in the capacity insertion region 160, via-conductors for connections with the unit capacity cells 10a arranged in the capacity insertion regions 161, 162, 163 adjacent to the memory blocks 140, 141 and CPU core 150 are arranged on the basis of the via-arrangement rules recorded in the data file D6. Thus, the VD metal layers 21 and VS metal layers 22 of the unit capacity cells 10a can be respectively connected to the power source wiring lines 191 and ground wiring lines 192 by the via-conductors so as to insert decoupling capacitors between both the wiring lines.

In this way, the arrangements of the input/output block, function blocks, unit cells, various wiring lines etc. and also the capacitors in the IC chip 100 have been designed. Therefore, the layout pattern data of the IC chip 100 finished up is recorded in the data file D10, and the design is completed. Accordingly, the IC chip 100 including the large number of unit capacity cells 10a in the capacity insertion regions 160 etc. can be manufactured by a known process on the basis of the arrangements, concretely, the layout pattern data.

By the way, in this embodiment, not only the capacity insertion region 160, but also the capacity insertion regions 161, 162, 163 are held in the open region 115, and the unit capacity cell blocks 10 (unit capacity cells 10a) are arranged here. It is also possible, however, to hold only the capacity insertion region 160 without holding the capacity insertion regions 161, 162, 163. In that case, the above step S11 is, of course, unnecessary.

As thus far described, according to the design system SYS of this embodiment, the IC chip 100 in which the decoupling capacitors each consisting of the large number of unit capacity cells 10a and having the combined capacitance value Ci are held in adjacency to the analog-signal-circuit blocks 120, 130, concretely, in the capacity insertion regions 160 etc. between the analog-signal-circuit blocks 120, 130 and the input/output block 110 can be designed with ease and automatically without depending upon the skill of the designer. Therefore, the IC chip 100 becomes capable of operating stably or exhibiting good characteristics.

Moreover, according to the design method of this embodiment, the IC chip 100 in which the decoupling capacitors each consisting of the large number of unit capacity cells 10a and having the combined capacitance value Ci are held in the capacity insertion region 160 etc. can be designed with ease and automatically without depending upon the skill of the designer.

Furthermore, the IC chip 100 of this embodiment holds the decoupling capacitor consisting of the large number of unit capacity cells 10a and having the combined capacitance value Ci, in the capacity insertion region 160, and it becomes capable of operating stably or exhibiting good characteristics. Besides, since the IC chip 100 can be easily designed, it can be made an inexpensive one.

(Modification 1)

Figure 15:
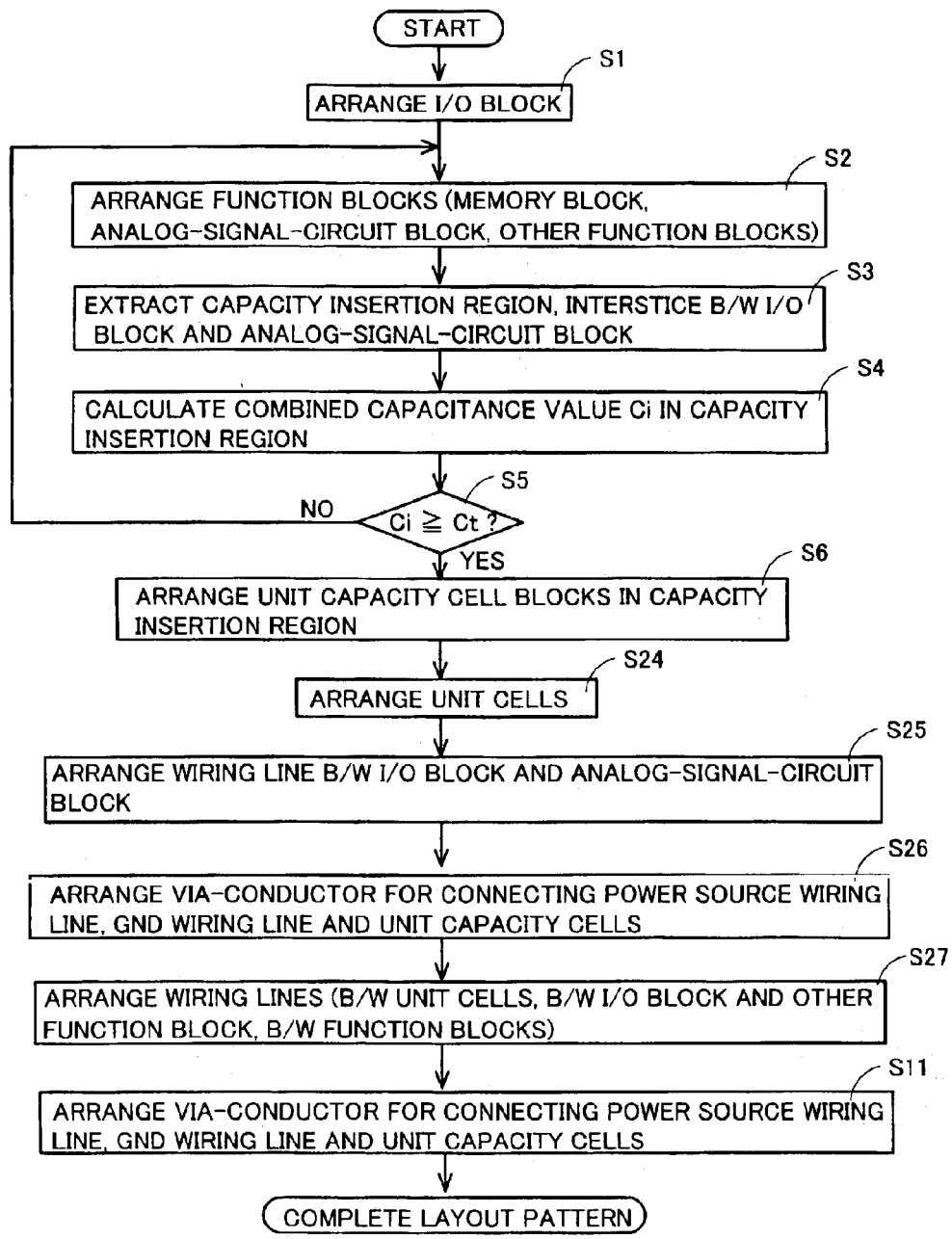
FIG. 15 is a flow chart showing the design procedure of an IC chip according to Modification 1.

Next, Modification 1 will be described with reference to FIGS. 15 and 16. This modification 1 employs unit capacity cells 10a similar to those of the foregoing embodiment. In the embodiment, however, after the unit capacity cell blocks 10 are arranged in the capacity insertion regions 160 etc., the analog wiring lines 170 are arranged between the input/output block 110 and the analog-signal-circuit blocks 120, 130, the VD via-conductors 173 and VS via-conductors 174 are further arranged, and the unit cells 180 are thereafter arranged. On the other hand, this modification 1 differs from the embodiment in the point that, after unit capacity cell blocks are arranged in capacity insertion regions, unit cells are arranged earlier. Accordingly, different parts shall be chiefly described by simplifying or omitting similar parts.

In this modification 1, as in the foregoing embodiment, an input/output block 110 is arranged at a step S1, and function blocks such as analog-signal-circuit blocks 120 are arranged at a step S2. Thereafter, at a step S3, capacity insertion regions 160 etc. are extracted from within an open region 115 such as the interstices between the input/output block 110 and the analog-signal-circuit blocks 120, 130, whereupon combined capacitance values Ci are calculated at a step S4. The combined capacitance value Ci is compared with a demanded capacitance value Ct at a step S5. Subject to Ci<Ct, the routine returns to the step S2, at which the function blocks 120 etc. are rearranged. Subject to Ci≧Ct, the routine proceeds to a step S6, at which unit capacity cell blocks 10 are arranged in a latticed pattern so as to be spread all over the capacity insertion regions 160 etc. Incidentally, the data files D1–D3 are employed at these steps.

Figure 16:
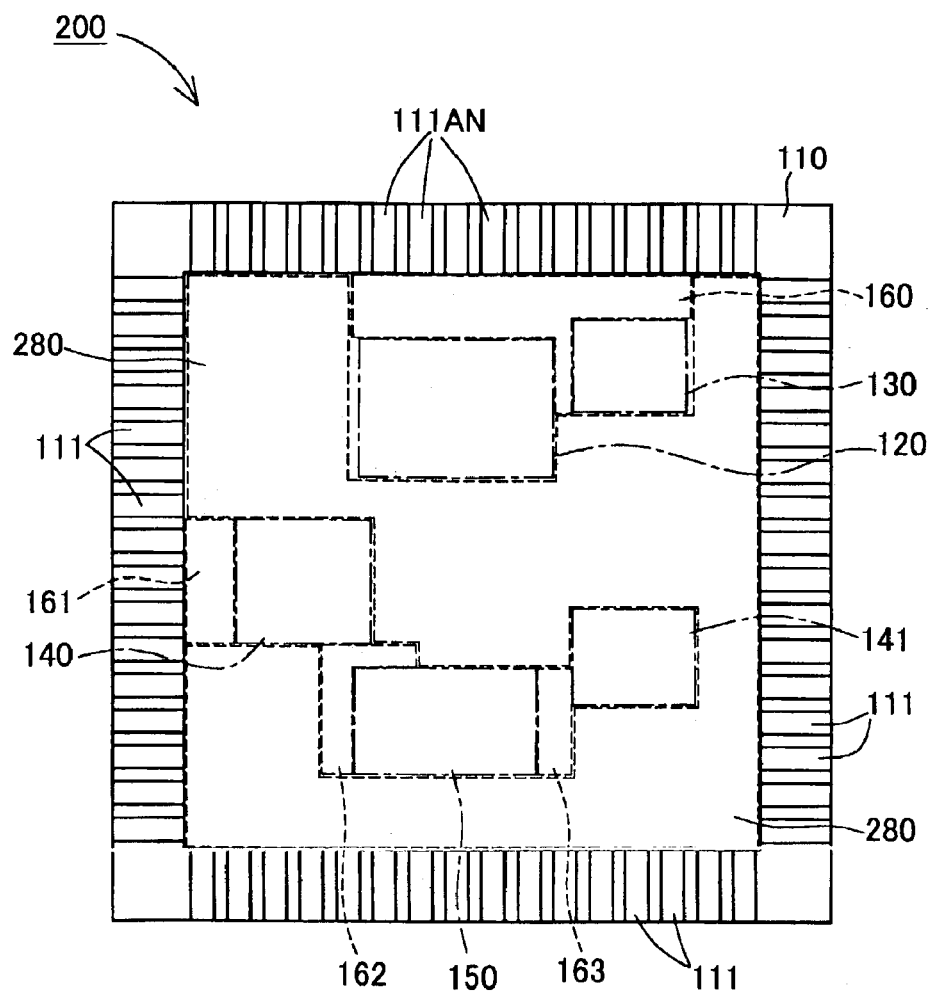
FIG. 16 is an explanatory view showing a state where unit cells are arranged in that open region of the IC chip in which function blocks and unit capacity cell blocks are not arranged.

Thereafter, in this modification 1, at a step S24, as shown in FIG. 16, unit cells 280 are arranged in a region which is not occupied by any of the input/output block 110 and the function blocks such as analog-signal-circuit blocks 120, 130, the capacity insertion regions 160, 161, 162, 163, etc., by employing the data file D7.

Subsequently, at a step S25, as in the foregoing embodiment (refer to FIG. 11), analog wiring lines 170 are arranged between the input/output block 110 and the analog-signal-circuit blocks 120, 130 on the basis of the wiring rules of the data file D4 and the circuit connection data of the data file D5. Concretely, the arrangement of the analog wiring lines 170 which are to be laid between the analog input/output terminal sections 111AN of the input/output block 110 and the analog-signal-circuit blocks 120, 130 is determined. It is also similar that the analog wiring lines 170 include VD wiring (power source wiring) lines 171 and VS wiring (ground wiring) lines 172 for supplying power to the analog-signal-circuit blocks 120, 130.

Further, at a step S26, as in the foregoing embodiment (refer to FIG. 12), a large number of VD via-conductors 173 are arranged within parts where VD metal layers 21 and the VD wiring lines 171 overlap each other as viewed in the thickness direction of an IC chip 200, on the basis of the via-arrangement rules of the data file D6, while a large number of VS via-conductors 174 are similarly arranged within parts where VS metal layers 22 and the VS wiring lines 172 overlap each other. Thus, the unit capacity cell blocks 10 (unit capacity cells 10a) arranged in the capacity insertion region 160 can be connected with the VD wiring lines 171 and the VS wiring lines 172.

Thereafter, at a step S27, as in the foregoing embodiment (refer to FIG. 14), wiring lines 190 are arranged for the connections between the unit cells 280, between the input/output block 110 and the unit cells 280, between the input/output block 110 and the function blocks such as memory blocks 140, 141 and a CPU core 150, between the function blocks, and so forth, on the basis of the wiring rules of the data file D4 and the circuit connection data of the data file D5.

The wiring lines 190 include power source wiring lines 191 and ground wiring lines 192. Therefore, at a step S11, as in the foregoing embodiment, via-conductors for connections with the unit capacity cells 10a arranged in the capacity insertion regions 161, 162, 163 are arranged in connections with the power source wiring lines 191 and the ground wiring lines 192 on the basis of the via-arrangement rules of the data file D6. Thus, the VD metal layers 21 and VS metal layers 22 of the unit capacity cells 10a can be respectively connected to the power source wiring lines 191 and ground wiring lines 192 by the via-conductors so as to insert decoupling capacitors between both the wiring lines.

In this way, also in this modification 1, the arrangements of the input/output block, function blocks, unit cells, various wiring lines etc. and also the capacitors in the IC chip 200 have been designed. Then, the layout pattern data of the IC chip 200 finish up is recorded in the data file D10, and the design is completed. Accordingly, the IC chip 200 including the large number of unit capacity cells 10a in the capacity insertion regions 160 etc. can be manufactured by a known process on the basis of the arrangements.

As thus far described, even with the design system of this modification 1, the IC chip 200 in which the decoupling capacitors are held can be designed with ease and automatically without depending upon the skill of a designer.

Moreover, according to the design method of this modification 1, the IC chip 200 in which the decoupling capacitors are held can be designed with ease and automatically without depending upon the skill of the designer.

Furthermore, the IC chip 200 of this modification 1 is formed with the decoupling capacitors, and it becomes capable of operating stably or exhibiting good characteristics. Besides, since the IC chip 200 can be easily designed, it can be made an inexpensive one.

(Modification 2)

Figure 17:
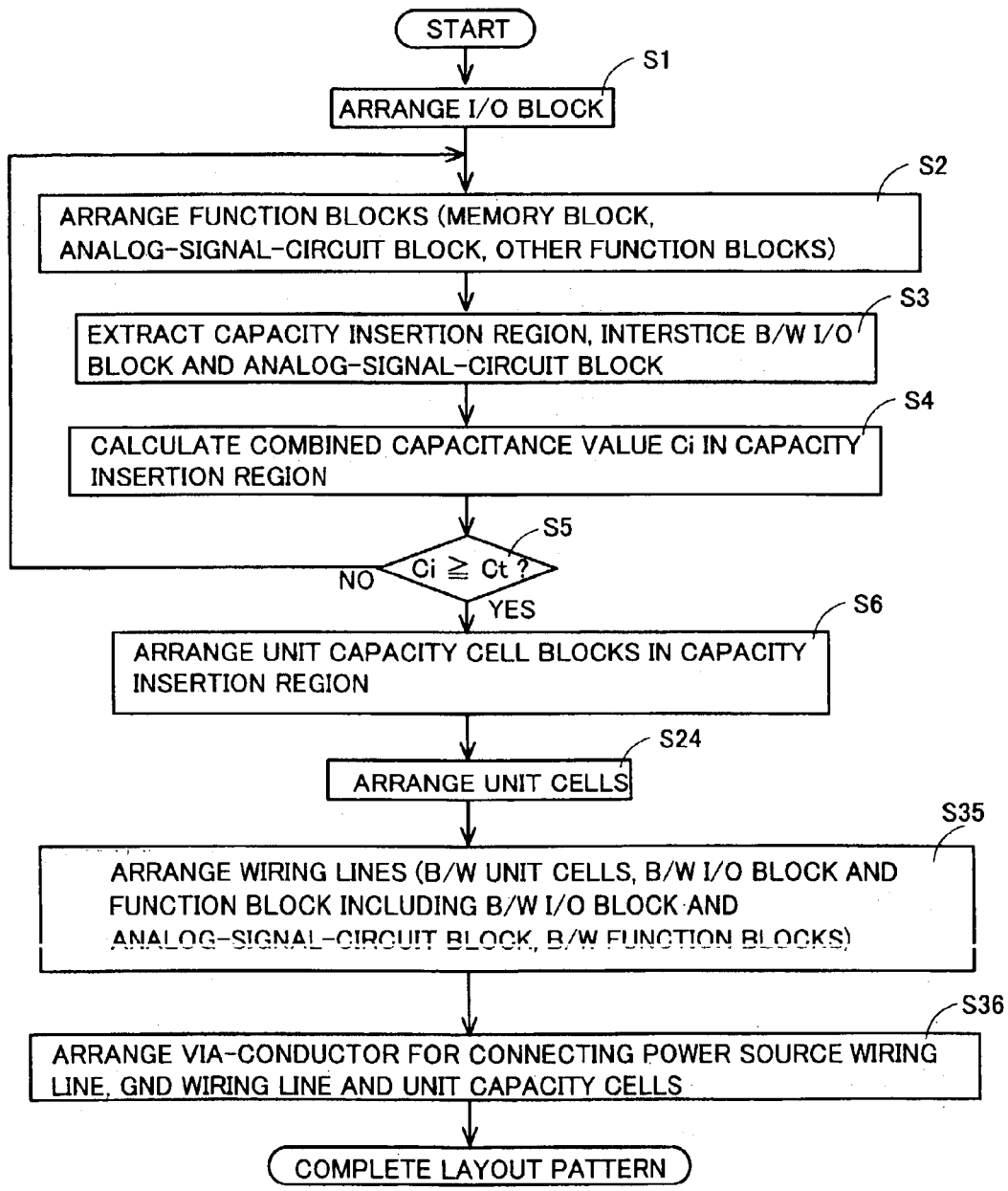
FIG. 17 is a flow chart showing the design procedure of an IC chip according to Modification 2.

Next, Modification 2 will be described with reference to the flowchart of FIG. 17. Also this modification 2 employs unit capacity cells 10a similar to those of the foregoing embodiment or the modification 1. In the embodiment and the modification 1, however, after the unit capacity cell blocks are arranged in the capacity insertion regions, the wiring lines between the input/output block and the analog-signal-circuit blocks are laid before the wiring lines between the input/output block and the other function blocks and unit cells. On the other hand, this modification 2 differs from the embodiment and the modification 1 in the point of laying the wiring lines between the input/output block and the function blocks and unit cells as include the wiring lines between the input/output parts shall be chiefly described by simplifying or omitting similar parts.

In this modification 2, as in the foregoing embodiment, an input/output block 110 is arranged at a step S1, and function blocks are arranged at a step S2. Thereafter, at a step S3, capacity insertion regions are extracted from within an open region 115 between the input/output block 110 and the function blocks, such as the interstices between the input/output block 110 and analog-signal-circuit blocks 120, 130, and between the function blocks, whereupon combined capacitance values Ci are calculated at a step S4. The combined capacitance value Ci is compared with a demanded capacitance value Ct at a step S5. Subject to Ci<Ct, the routine returns to the step S2, at which the function blocks 120 etc. are rearranged. Subject to Ci≧Ct, the routine proceeds to a step S6, at which unit capacity cell blocks 10 are arranged in a latticed pattern so as to be spread all over the capacity insertion regions 160 etc. Incidentally, the data files D1–D3 are employed at these steps.

Further, as in the foregoing modification 1, at a step S24, unit cells 280 are arranged in a region which is not occupied by any of the input/output block 110 and the function blocks such as analog-signal-circuit blocks 120, 130, the capacity insertion regions 160, 161, 162, 163, etc., by employing the data file D7 (refer to FIG. 16).

Thereafter, at a step S35, wiring lines 190 are arranged for the connections between the unit cells 280, between the input/output block 110 and the unit cells 280, between the input/output block 110 and the other function blocks such as between the input/output block 110 and memory blocks 140, 141 or a CPU core 150, between the function blocks such as the analog-signal-circuit blocks 120, 130 and the memory blocks 140, 141 or CPU core 150, and so forth, on the basis of the wiring rules of the data file D4 and the circuit connection data of the data file D5 (refer to FIG. 14). The wiring lines 190 also include analog wiring lines 170 which connect the input/output block 110 (specifically, analog input/output terminal sections 111AN) and the analog-signal-circuit blocks 120, 130.

Power source wiring lines 191 and ground wiring lines 192 for supplying electric power (a power source potential and a ground potential) to various portions, respectively, are included among the wiring lines 190 arranged at the step S35. Besides, VD wiring lines 171 and VS wiring lines 172 are included among the analog wiring lines 170. Therefore, the arrangements of the power source wiring lines 191 and ground wiring lines 192 and the VD wiring lines 171 and VS wiring lines 172 are followed by a step S36, at which via-conductors for connections with the unit capacity cells 10a in the capacity insertion regions 160, 161, 162, 163 mentioned above are arranged on the basis of the via-arrangement rules of the data file D6. Thus, the VD metal layers 21 and VS metal layers 22 of the unit capacity cells 10a can be respectively connected to the power source wiring lines 191 or VD wiring lines 171 and the ground wiring lines 192 or VS wiring lines 172 by the via-conductors so as to insert decoupling capacitors between the power source wiring line 191 and the ground wiring line 192 and between VD wiring line 171 and VS wiring line.

In this way, also in this modification 2, the arrangements of the input/output block, function blocks, unit cells, various wiring lines etc. and also the capacitors in an IC chip 200 have been designed. Then, the layout pattern data of the IC chip 200 finished up is recorded in the data file D10, and the design is of unit capacity cells 10a in the capacity insertion regions 160 etc. can be manufactured by a known process on the basis of the arrangements.

As thus far described, even with the design system of this modification 2, the IC chip 200 in which the decoupling capacitors are held can be designed with ease and automatically without depending upon the skill of a designer.

Moreover, according to the design method of this modification 2, the IC chip 200 in which the decoupling capacitors are held can be designed with ease and without depending upon the skill of the designer.

Furthermore, the IC chip 200 of this modification 2 is formed with the decoupling capacitors, and it becomes capable of operating stably or exhibiting good characteristics. Besides, since the IC chip 200 can be easily designed, it can be made an inexpensive one.

In the above, the present invention has been described in conjunction with the embodiment and the modifications 1, 2. Needless to say, however, the present invention is not restricted to the embodiment etc., but it can be appropriately altered and applied within a scope not departing from the purport thereof.

By way of example, although the unit capacity cell 10a utilizing the gate oxide film 15a of the MOSFET as the dielectric is employed in the foregoing embodiment etc. (refer to FIGS. 6–10), a capacitor in any other aspect can also be employed as a unit capacity cell. The unit capacity cell may well have, for example, a shape in which an $SiO_2$ oxide film is formed on a flat lower layer made of poly-silicon or a metal such as aluminum and is overlaid with a flat upper layer made of poly-silicon or a metal, so as to array such unit capacity cells.

The MOSFET, however, is easy of enlarging an electro-static capacitance for the reasons that it can be easily designed owing to the technique already established in the design and production of IC chips, and that the gate oxide film 15a can be controlled to a very small thickness. Another advantage in manufacture is that the unit capacity cells 10a mentioned in the embodiment etc. can also be formed simultaneously with the formation of the other MOSFETs.

Further, in the foregoing embodiment etc., the unit capacity cell block 10 (unit capacity cell 10a) employed is square as viewed in plan. However, an oblong unit capacity cell block can also be employed. Besides, when the connection of a unit capacity cell with an adjacent one is considered, a triangular or hexagonal shape, the combination of a plurality of shapes, or the like can be appropriately adopted.

Still further, although the aspect of the N-channel MOSFET is utilized for the unit capacity cell 10a in the foregoing embodiment etc., a P-channel MOSFET or both the N-channel and P-channel MOSFETs can be employed.

Yet further, although the semiconductor integrated circuit of coexistent analog/digital circuits in which the function blocks include, not only the analog-signal-circuit blocks 120, 130, but also the memory blocks 140, 141 has been exemplified in the embodiment etc., the present invention is also applicable to an analog LSI formed of analog-signal-circuit blocks and the design thereof, or to a digital LSI formed only of digital circuits and the design thereof.

What is claimed is:

1. A design system of a semiconductor integrated circuit element, comprising:

an input/output-block arrangement unit for determining arrangement of an input/output block;

a function-block arrangement unit for determining arrangement of all function blocks which include an analog-signal-circuit block;

a unit-capacity-cell arrangement unit for arranging a plurality of unit capacity cell blocks in adjacency to each other in a latticed pattern, at least, an interstice between the input/output block and the analog-signal-circuit block within that open region of an element region which does not belong to either the input/output block or the function blocks; the unit capacity cell blocks symbolizing unit capacity cells each of which includes a unit capacitor composed of a first electrode to be set at a first power source potential, a dielectric layer, and a second electrode opposing to the first electrode through the dielectric layer and to be set at a second power source potential, and which have such a connection wiring pattern that, when the unit capacity cells are arranged in adjacency to each other, the first electrodes of the adjacent unit capacity cells can be electrically connected to each other, while the second electrodes thereof can be electrically connected to each other, wherein the unit capacity cell is a rectangular-shaped unit capacity cell which is shaped rectangular when viewed in plan, and in which the first electrode and the second electrode are electrically lead out to every side, and lead-out positions of the first electrode and the second electrode are held in a relationship of a mirror image between opposing sides, and the unit-capacity-cell arrangement unit arranges rectangular-shaped unit capacity cell blocks symbolizing a plurality of such rectangular-shaped unit capacity cells, in adjacency to each other in the latticed pattern;

an analog-wiring arrangement unit for determining arrangement of wiring lines between the input/output block and the analog-signal-circuit block; and a via-conductor arrangement unit for determining arrangement of at least one first via-conductor which is electrically connected with the first electrode while extending from at least one first power source wiring line to be set at the first power source potential, among the wiring lines, and at least one second via-conductor which is electrically connected with the second electrode while extending from at least one second power source wiring line to be set at the second power source potential, among the wiring lines.

2. A design system of a semiconductor integrated circuit element according to claim 1, wherein:

the function-block arrangement unit includes:

a tentative arrangement unit for tentatively arranging the function blocks;

an extraction unit for extracting a capacity insertion region in which the plurality of unit capacity cell blocks are arranged;

a combined capacitance calculation unit for calculating a combined capacitance value which is obtained in case of arranging the unit capacity cell blocks in the capacity insertion region; and a comparison unit for comparing the combined capacitance value with a predetermined demanded capacitance value, for returning to the tentative arrangement unit when the combined capacitance value is smaller than the demanded capacitance value, and for determining a position of the tentative arrangement as a position of the function block when the combined capacitance value is, same as or larger than the demanded capacitance value; and the unit-capacity-cell arrangement unit arranges the unit capacity cell blocks in the capacity insertion region.

3. A design system of a semiconductor integrated circuit element according to claim 1, wherein the unit capacity cell has a MOSFET structure, in which a drain, a source and a back gate are short-circuited, and the unit capacitor is constructed between them and a gate.

4. A computer program for designing a semiconductor integrated circuit element, the computer program comprising instructions for causing a computer to perform a method comprising:

determining arrangement of an input/output block;

determining arrangement of all function blocks which include an analog-signal-circuit block;

arranging a plurality of unit capacity cell blocks in adjacency to each other in a latticed pattern, at least, an interstice between the input/output block and the analog-signal-circuit block within that open region of an element region which does not belong to either the input/output block or the function blocks; the unit capacity cell blocks symbolizing unit capacity cells each of which includes a unit capacitor composed of a first electrode to be set at a first power source potential, a dielectric layer, and a second electrode opposing to the first electrode through the dielectric layer and to be set at a second power source potential, and which have such a connection wiring pattern that, when the unit capacity cells are arranged in adjacency to each other, the first electrodes of the adjacent unit capacity cells can be electrically connected to each other, while the second electrodes thereof can be electrically connected to each other, wherein the unit capacity cell is a rectangular-shaped unit capacity cell which is shaped rectangular when viewed in plan, and in which the first electrode and the second electrode are electrically lead out to every side, and lead-out positions of the first electrode and the second electrode are held in a relationship of a mirror image between opposing sides, and the unit-capacity-cell arrangement unit arranges rectangular-shaped unit capacity cell blocks symbolizing a plurality of such rectangular-shaped unit capacity cells, in adjacency to each other in the latticed pattern;

determining arrangement of wiring lines between the input/output block and the analog-signal-circuit block; and determining arrangement of at least one first via-conductor which is electrically connected with the first electrode while extending from at least one first power source wiring line to be set at the first power source potential, among the wiring lines, and at least one second via-conductor which is electrically connected with the second electrode while extending from at least one second power source wiring line to be set at the second power source potential, among the wiring lines.

5. A computer program product for designing a semiconductor integrate circuit element, the computer program product comprising:

a computer readable medium; and a computer program stored on the computer readable medium, the computer program comprising instructions for causing a computer to perform a method comprising:

determining arrangement of an input/output block;

determining arrangement of all function blocks which include an analog-signal-circuit block;

arranging a plurality of unit capacity cell blocks in adjacency to each other in a latticed pattern, at least, an interstice between the input/output block and the analog-signal-circuit block within that open region of an element region which does not belong to either the input/output block or the function blocks; the unit capacity cell blocks symbolizing unit capacity cells each of which includes a unit capacitor composed of a first electrode to be set at a first power source potential, a dielectric layer, and a second electrode opposing to the first electrode through the dielectric layer and to be set at a second power source potential, and which have such a connection wiring pattern that, when the unit capacity cells are arranged in adjacency to each other, the first electrodes of the adjacent unit capacity cells can be electrically connected to each other, while the second electrodes thereof can be electrically connected to each other, wherein the unit capacity cell is a rectangular-shaped unit capacity cell which is shaped rectangular when viewed in plan, and in which the first electrode and the second electrode are electrically lead out to every side, and lead-out positions of the first electrode and the second electrode are held in a relationship of a mirror image between opposing sides, and the unit-capacity-cell arrangement unit arranges rectangular-shaped unit capacity cell blocks symbolizing a plurality of such rectangular-shaped unit capacity cells, in adjacency to each other in the latticed pattern;

determining arrangement of wiring lines between the input/output block and the analog-signal-circuit block; and determining arrangement of at least one first via-conductor which is electrically connected with the first electrode while extending from at least one first power source wiring line to be set at the first power source potential, among the wiring lines, and at least one second via-conductor which is electrically connected with the second electrode while extending from at least one second power source wiring line to be set at the second power source potential, among the wiring lines.

6. A design system of a semiconductor integrated circuit element comprising:

an input/output-block arrangement unit for determining arrangement of an input/output block;

a function-block arrangement unit for determining arrangement of all function blocks;

a unit-capacity-cell arrangement unit for arranging a plurality of unit capacity cell blocks in adjacency to each other, in an interstice between the input/output block and the function block or in an interstice between the function blocks within that open region of the element region which does not belong to either the input/output block or the function blocks; the unit capacity cell blocks symbolizing unit capacity cells each of which includes a unit capacitor composed of a first electrode to be set at a first power source potential, a dielectric layer, and a second electrode opposing to the first electrode through the dielectric layer and to be set at a second power source potential, and which have such a connection wiring pattern that, when the unit capacity cells are arranged in adjacency to each other, the first electrodes of the adjacent unit capacity cells can be electrically connected to each other, while the second electrodes thereof can be electrically connected to each other, wherein the unit capacity cell is a rectangular-shaped unit capacity cell which is shaped rectangular when viewed in plan, and in which the first electrode and the second electrode are electrically lead out to every side, and lead-out positions of the first electrode and the second electrode are held in a relationship of a mirror image between opposing sides, and the unit-capacity-cell arrangement unit arranges rectangular-shaped unit capacity cell blocks symbolizing a plurality of such rectangular-shaped unit capacity cells, in adjacency to each other in the latticed pattern;

a wiring arrangement unit for determining arrangement of wiring lines between the input/output block and the function blocks and wiring lines between the function blocks; and a via-conductor arrangement unit for determining arrangement of at least one first via-conductor which is electrically connected with the first electrode while extending from at least one first power source wiring line to be set at the first power source potential, among the wiring lines, and at least one second via-conductor which is electrically connected with the second electrode while extending from at least one second power source wiring line to be set at the second power source potential, among the wiring lines.

7. A design system of a semiconductor integrated circuit element according to claim 6, wherein:

the function-block arrangement unit includes:

a tentative arrangement unit for tentatively arranging the function blocks;

an extraction unit for extracting a capacity insertion region in which the plurality of unit capacity cell blocks are arranged;

combined capacitance calculation unit for calculating a combined capacitance value which is obtained in case of arranging the unit capacity cell blocks in the capacity insertion region; and a comparison unit for comparing the combined capacitance value with a predetermined demanded capacitance value, for returning to the tentative arrangement unit when the combined capacitance value is smaller than the demanded capacitance value, and for determining a position of the tentative arrangement as a position of the function block when the combined capacitance value is, same as or larger than the demanded capacitance value; and the unit-capacity-cell arrangement unit arranges the unit capacity cell blocks in the capacity insertion region.

8. A design system of a semiconductor integrated circuit element according to claims 6, wherein the unit capacity cell has a MOSFET structure, in which a drain, a source and a back gate are short-circuited, and the unit capacitor is constructed between them and a gate.

9. A computer program for designing a semiconductor integrated circuit element, the computer program comprising instructions for causing a computer to perform a method comprising:

determining arrangement of an input/output block;

determining arrangement of all function blocks;

arranging a plurality of unit capacity cell blocks in adjacency to each other in a latticed pattern, an interstice between the input/output block and the function block or in an interstice between the function blocks within that open region of the element region which does not belong to either the input/output block or the function blocks; the unit capacity cell blocks symbolizing unit capacity cells each of which includes a unit capacitor composed of a first electrode to be set at a first power source potential, a dielectric layer, and a second electrode opposing to the first electrode through the dielectric layer and to be set at a second power source potential, and which have such a connection wiring pattern that, when the unit capacity cells are arranged in adjacency to each other, the first electrodes of the adjacent unit capacity cells can be electrically connected to each other, while the second electrodes thereof can be electrically connected to each other, wherein the unit capacity cell is a rectangular-shaped unit capacity cell which is shaped rectangular when viewed in plan, and in which the first electrode and the second electrode are electrically lead out to every side, and lead-out positions of the first electrode and the second electrode are held in a relationship of a mirror image between opposing sides, and the unit-capacity-cell arrangement unit arranges rectangular-shaped unit capacity cell blocks symbolizing a plurality of such rectangular-shaped unit capacity cells, in adjacency to each other in the latticed pattern;

determining arrangement of wiring lines between the input/output block and the function blocks and wiring lines between the function blocks; and determining arrangement of at least one first via-conductor which is electrically connected with the first electrode while extending from at least one first power source wiring line to be set at the first power source potential, among the wiring lines, and at least one second via-conductor which is electrically connected with the second electrode while extending from at least one second power source wiring line to be set at the second power source potential, among the wiring lines.

10. A computer program product for designing a semiconductor integrated circuit element, the computer program product comprising:

a computer readable medium; and a computer program stored on the computer readable medium, the computer program comprising instructions for causing a computer to perform a method comprising:

determining arrangement of an input/output block;

determining arrangement of all function blocks;

arranging a plurality of unit capacity cell blocks in adjacency to each other in a latticed pattern, in an interstice between the input/output block and the function block or in an interstice between the function blocks within that open region of the element region which does not belong to either the input/output block and the function blocks; the unit capacity cell blocks symbolizing unit capacity cells each of which includes a unit capacitor composed of a first electrode to be set at a first power source potential, a dielectric layer, and a second electrode opposing to the first electrode through the dielectric layer and to be set at a second power source potential, and which have such a connection wiring pattern that, when the unit capacity cells are arranged in adjacency to each other, the first electrodes of the adjacent unit capacity cells can be electrically connected to each other, while the second electrodes thereof can be electrically connected to each other, wherein the unit capacity cell is a rectangular-shaped unit capacity cell which is shaped rectangular when viewed in plan, and in which the first electrode and the second electrode are electrically lead out to every side, and lead-out positions of the first electrode and the second electrode are held in a relationship of a mirror image between opposing sides, and the unit-capacity-cell arrangement unit arranges rectangular-shaped unit capacity cell blocks symbolizing p plurality of such rectangular-shaped unit capacity cells, in adjacency to each other in the latticed pattern;

determining arrangement of wiring lines between the input/output block and the function blocks and wiring lines between the function blocks; and determining arrangement of at least one first via-conductor which is electrically connected with the first electrode while extending from at least one first power source wiring line to be set at the first power source potential, among the wiring lines, and at least one second via-conductor which is electrically connected with the second electrode while extending from at least one second power source wiring line to be set at the second power source potential, among the wiring lines.

11. A design method of a semiconductor integrated circuit element, in a method of designing a semiconductor integrated circuit element in an element region, comprising:

determining arrangement of an input/output block;

determining arrangement of all function blocks which include an analog-signal-circuit block;

arranging a plurality of unit capacity cell blocks in adjacency to each other in a latticed, pattern in at least, an interstice between the input/output block and the analog-signal-circuit block within that open region of the element region which does not belong to either the input/output block or the function blocks; the unit capacity cell blocks symbolizing unit capacity cells each of which includes a unit capacitor composed of a first electrode to be set at a first power source potential, a dielectric layer, and a second electrode opposing to the first electrode through the dielectric layer and to be set at a second power source potential, and which have such a connection wiring pattern that, when the unit capacity cells are arranged in adjacency to each other, the first electrodes of the adjacent unit capacity cells can be electrically connected to each other, while the second electrodes thereof can be electrically connected to each other, wherein the unit capacity cell is a rectangular-shaped unit capacity cell which is shaped rectangular when viewed in plan, and in which the first electrode and the second electrode are electrically lead out to every side, and lead-out positions of the first electrode and the second electrode are held in a relationship of a mirror image between opposing sides, and arranging the rectangular-shaped unit capacity cell blocks symbolizing a plurality of such rectangular-shaped unit capacity cells, in adjacency to each other in the latticed pattern;

determining arrangement of wiring lines between the input/output block and the analog-signal-circuit block; and determining arrangement of at least one first via-conductor which is electrically connected with the first electrode while extending from at least one first power source wiring line to be set at the first power source potential, among the wiring lines, and at least one second via-conductor which is electrically connected with the second electrode while extending from at least one second power source wiring line to be set at the second power source potential, among the wiring lines.

12. A design method of a semiconductor integrated circuit element according to claim 11, wherein:

the determining the arrangement of all function blocks includes:

tentatively arranging the function blocks;

extracting a capacity insertion region in which the plurality of unit capacity cell blocks are arranged;

calculating a combined capacitance value which is obtained in case of arranging the unit capacity cell blocks in the capacity insertion region;

comparing the combined capacitance value with a predetermined demanded capacitance value, for returning to tentatively arranging of the function blocks when the combined capacitance value is smaller than the demanded capacitance value, and for determining a position of the tentative arrangement as a position of the function block when the combined capacitance value is, same as or larger than the demanded capacitance value; and arranging the unit capacity cell blocks in the capacity insertion region.

13. A design method of a semiconductor integrated circuit element according to claim 11, wherein the unit capacity cell has a MOSFET structure, in which a drain, a source and a back gate are short-circuited, and the unit capacitor is constructed between them and a gate.

14. A design method of a semiconductor integrated circuit element, in a method of designing a semiconductor integrated circuit element in an element region, comprising:

determining arrangement of an input/output block;

determining arrangement of all function blocks;

arranging a plurality of unit capacity cell blocks in adjacency to each other in a latticed pattern, in an interstice between the input/output block and the function block or in an interstice between the function blocks within that open region of the element region which does not belong to either the input/output block or the function blocks; the unit capacity cell blocks symbolizing unit capacity cells each of which includes a unit capacitor composed of a first electrode to be set at a first power source potential, a dielectric layer, and a second electrode opposing to the first electrode through the dielectric layer and to be set at a second power source potential, and which have such a connection wiring pattern that, when the unit capacity cells are arranged in adjacency to each other, the first electrodes of the adjacent unit capacity cells can be electrically connected to each other, while the second electrodes thereof can be electrically connected to each other, wherein the unit capacity cell is a rectangular-shaped unit capacity cell which is shaped rectangular when viewed in plan, and in which the first electrode and the second electrode are electrically lead out to every side, and lead-out positions of the first electrode and the second electrode are held in a relationship of a mirror image between opposing sides, and arranging the rectangular-shaped unit capacity cell blocks symbolizing a plurality of such rectangular-shaped unit capacity cells, in adjacency to each other in the latticed pattern;

determining arrangement of wiring lines between the input/output block and the function blocks and wiring lines between the function blocks; and determining arrangement of at least one first via-conductor which is electrically connected with the first electrode while extending from at least one first power source wiring line to be set at the first power source potential, among the wiring lines, and at least one second via-conductor which is electrically connected with the second electrode while extending from at least one second power source wiring line to be set at the second power source potential, among the wiring lines.

15. A design method of a semiconductor integrated circuit element according to claim 14, wherein:

the determining the arrangement of all function blocks includes:

tentatively arranging the function blocks;

extracting a capacity insertion region in which the plurality of unit capacity cell blocks are arranged;

calculating a combined capacitance value which is obtained in case of arranging the unit capacity cell blocks in the capacity insertion region; and comparing the combined capacitance value with a predetermined demanded capacitance value, for returning to tentatively arranging the function blocks when the combined capacitance value is smaller than the demanded capacitance value, and for determining a position of the tentative arrangement as a position of the function block when the combined capacitance value is, same as or larger than the demanded capacitance value; and arranging the unit capacity cell blocks in the capacity insertion region.

16. A design method of a semiconductor integrated circuit element according to claim 14, wherein the unit capacity cell has a MOSFET structure, in which a drain, a source and a back gate are short-circuited, and the unit capacitor is constructed between them and a gate.

17. A semiconductor integrated circuit element which is formed on a substrate, and which has an input/output block and a plurality of function blocks partitioned in a direction of a plane of the substrate, comprising:

a plurality of unit capacity cells which are arranged adjacency to each other in a latticed pattern within an open region that does not belong to either the input/output block or the function blocks; each of the unit capacity cells including a unit capacitor which is composed of a first electrode to be set at a first power source potential, a dielectric layer, and a second electrode opposing to the first electrode through the dielectric layer and to be set at a second power source potential; the unit capacity cells having such a connection wiring pattern that, when the unit capacity cells are arranged in adjacency to each other in the direction of the plane, the first electrodes of the adjacent unit capacity cells can be electrically connected to each other, while the second electrodes thereof can be electrically connected to each other; the first electrodes and the second electrodes of the adjacent unit capacity cells being electrically connected to each other, respectively, wherein the unit capacity cell is a rectangular-shaped unit capacity cell which is shaped rectangular when viewed in plan, and in which the first electrode and the second electrode are electrically lead out to every side, and lead-out positions of the first electrode and the second electrode are held in a relationship of a mirror image between opposing sides, and a plurality of such rectangular-shaped unit capacity cells are arranged in adjacency to each other in the latticed pattern, within the open region.

18. A semiconductor integrated circuit element according to claim 17, wherein:

at least one first power source wiring line which is set at the first power source potential, and at least one second power source wiring line which is set at the second power source potential, are formed on a front surface side of the substrate in a thickness direction thereof with respect to the plurality of unit capacity cells; and the first electrodes of the plurality of unit capacity cells are set at the first power source potential by at least one first via-conductor which extends from the first power source wiring line, while the second electrodes thereof are set at the second power source potential by at least one second via-conductor which extends from the second power source wiring line.

19. A semiconductor integrated circuit element according to claim 17, wherein the unit capacity cell has a MOSFET structure, in which a drain, a source and a back gate are short-circuited, and the unit capacitor is constructed between them and a gate.

20. A semiconductor integrated circuit element according to claim 18, wherein:

the plurality of unit capacity cells are formed in, at least, a region adjacent to an analog-signal-circuit block selected from the open region which is; and the first power source wiring line and the second power source wiring line are wiring lines which supply the power source potentials from the input/output block to the analog-signal-circuit block.

21. A semiconductor integrated circuit element according to claim 20, wherein the plurality of unit capacity cells are formed in, at least, that region held between the analog-signal-circuit block and the input/output block, which is a part of the open region.

* * * * *

UNITED STATES PATENT AND TRADEMARK OFFICE
CERTIFICATE OF CORRECTION

PATENT NO. : 6,941,535 B2 Page 1 of 1
DATED : September 6, 2005
INVENTOR(S) : Yuji Sekido It is certified that error appears in the above-identified patent and that said Letters Patent is hereby corrected as shown below:

<u>Column 22,</u>
Line 49, delete "p plurality" and insert -- a plurality --.

<u>Column 23,</u>
Line 5, after "latticed" delete "," and after "pattern" insert -- , --.

Signed and Sealed this

Fourth Day of April, 2006

JON W. DUDAS
*Director of the United States Patent and Trademark Office*